(12) United States Patent
Lee et al.

(10) Patent No.: US 12,744,068 B2
(45) Date of Patent: Sep. 22, 2026

(54) MAGNETIC MEMORY DEVICE HAVING MAGNETIC TUNNEL JUNCTION PATTERNS AND SPIN-ORBIT TORQUE LINES

(71) Applicant: Samsung Electronics Co., Ltd., Suwon-si (KR)

(72) Inventors: Yongjae Lee, Seongnam-si (KR); Jihun Byun, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1060 days.

(21) Appl. No.: 17/890,625

(22) Filed: Aug. 18, 2022

(65) Prior Publication Data

US 2023/0206975 A1 Jun. 29, 2023

(30) Foreign Application Priority Data

Dec. 23, 2021 (KR) ........................ 10-2021-0185716

(51) Int. Cl.
*G11C 11/16* (2006.01)
*H10B 61/00* (2023.01)
(Continued)

(52) U.S. Cl.
CPC ........ *G11C 11/161* (2013.01); *G11C 11/1655* (2013.01); *G11C 11/1657* (2013.01);
(Continued)

(58) Field of Classification Search
CPC ... G11C 11/161; G11C 11/1655; H10B 61/22; H10N 50/80; H10N 50/10; H10D 48/40
(Continued)

(56) References Cited

U.S. PATENT DOCUMENTS 9,337,418 B2 5/2016 Park et al.
10,068,946 B2 9/2018 Shimomura et al.
(Continued)

FOREIGN PATENT DOCUMENTS

KR 10-2016-0018270 A 2/2016

OTHER PUBLICATIONS

Lizhou Wu Et al., ‘Impact of Magnetic Coupling and Density on STT-MRAM Performance,’ *Design, Automation & Test in Europe Conference & Exhibition*, 2020.
(Continued)

*Primary Examiner* — Jami Valentine Miller
(74) *Attorney, Agent, or Firm* — Fish & Richardson P.C.

(57) ABSTRACT

Disclosed is a magnetic memory device comprising write and read word lines that extend in a first direction on a substrate, the write word line and the read word line spaced apart from each other in a second direction and parallel to a bottom surface of the substrate, first source/drain contacts on one side of the write word line and spaced apart from each other in the first direction, second source/drain contacts on one side of the read word line and spaced apart from each other in the first direction, magnetic tunnel junction patterns connected to the second source/drain contacts, and spin-orbit torque lines on the magnetic tunnel junction patterns and connected to the first source/drain contacts. The magnetic tunnel junction patterns are spaced apart from each other in a third direction. The spin-orbit torque lines are spaced apart from each other in the third direction.

20 Claims, 19 Drawing Sheets

(51) Int. Cl.
*H10D 48/40* (2025.01)
*H10N 50/10* (2023.01)
*H10N 50/80* (2023.01)

(52) U.S. Cl.
CPC ...... *G11C 11/1673* (2013.01); *G11C 11/1675* (2013.01); *H10B 61/22* (2023.02); *H10D 48/40* (2025.01); *H10N 50/10* (2023.02); *H10N 50/80* (2023.02)

(58) Field of Classification Search
USPC .......................................................... 257/421
See application file for complete search history.

(56) References Cited

U.S. PATENT DOCUMENTS 10,217,798 B2* 2/2019 Hu ....................... H10D 30/675
10,229,722 B2 3/2019 DeBrosse et al.
10,957,842 B2 3/2021 Takahashi
10,957,845 B2 3/2021 Noh et al.
10,998,489 B2 5/2021 Widdershoven et al.
11,004,490 B2 5/2021 Sakhare et al.
11,101,320 B2 8/2021 Hatcher et al.
2016/0043136 A1 2/2016 Kim et al.
2016/0276008 A1* 9/2016 Saida ....................... G11C 7/12
2018/0061467 A1* 3/2018 Kan .................... G11C 11/1659
2019/0035449 A1* 1/2019 Saida .................. G11C 11/1675
2019/0103552 A1* 4/2019 Shiokawa .......... G11C 13/0002
2019/0325961 A1* 10/2019 Jaiswal ................. G11C 11/419
2019/0362765 A1* 11/2019 Park .................... G11C 11/1675
2020/0075670 A1* 3/2020 Lin ........................ H10N 50/85
2020/0136016 A1* 4/2020 Lin ....................... H01F 41/307
2020/0395530 A1* 12/2020 Tsou ...................... H10N 50/10
2021/0005806 A1* 1/2021 Bak ........................ H10N 50/10
2021/0050508 A1* 2/2021 Lee ........................ H10N 50/10
2021/0134339 A1* 5/2021 Song ...................... H10N 50/85
2021/0134380 A1* 5/2021 Noh ...................... G11C 11/161
2021/0151667 A1* 5/2021 Shiokawa ........... H01F 10/3272
2021/0202827 A1* 7/2021 Song ...................... H10B 61/22
2023/0206975 A1* 6/2023 Lee ..................... G11C 11/1655
365/158

OTHER PUBLICATIONS

Noriyuki Sato Et al., 'Two-terminal spin-orbit torque magnetoresistive random access memory', *Nature Electronics*, vol. 1, Sep. 2018, pp. 508-511.
Shengjie Shi Et al., 'Fast Low-Current Spin-Orbit-Torque Switching of Magnetic Tunnel Junctions through Atomic Modifications of the Free-Layer Interfaces', *Physical Review Applied* 9, 011002 (2018).
K. Garello Et al., 'Manufacturable 300mm platform solution for Field-Free Switching SOT-MRAM', 2019 Symposium on VLSI Circuits.
Telem Simsek Etal., 'Field-Free Spin-Orbit Torque Switching in Magnetic Tunnel Junction Structures With Stray Fields,' *IEEE Magnetics Letters* vol. 12, 2021.
Kevin Garello Et al., 'Ultrafast magnetization switching by spin-orbit torques', *Applied Physics Letters* 105, 212402 (2014).
K. Garell Et al., 'SOT-MRAM 300mm integration for low power and ultrafast embedded memories', IEEE Symposium on VLSI Circuits 2018.
Bernard Dieney, et al. "Introduction to Magnetic Random-Access Memory," IEEE Press, The Institute of Electrical and Electronics Engineers, Inc., pp. 1-9, (2016).

* cited by examiner 155
145
BL
135
125
122
115
105
GC
GE
GI
WWL
ACT
C'
SL
SOT(MP)
FL
TBL
PL
MTJ
132
140
MC2
MC1
C
AF
ST
100
100L
VD
D1
D2

155
SOT(MP)
145
135
140
132
125
115
105
GC
GE
GI
RWL
ACT
D'
MC2
MC1
MC2
MC1
D
FL
TBL
PL
MTJ
122
BL
SL
132
BL
122
AF
ST
100
100L
D1
VD
D2

155
SOT
145
135
125
105
GC
GE
GI
WWL
ACT
B'
SL
SL
BL
AF
ST
100
B
MC1
MC2
MC1
MC2
D1
VD
D2

MAGNETIC MEMORY DEVICE HAVING MAGNETIC TUNNEL JUNCTION PATTERNS AND SPIN-ORBIT TORQUE LINES

CROSS-REFERENCE TO RELATED APPLICATION

This U.S. nonprovisional application claims priority under 35 U.S.C. § 119 to Korean Patent Application No. 10-2021-0185716 filed on Dec. 23, 2021 in the Korean Intellectual Property Office, the disclosure of which is hereby incorporated by reference in its entirety.

BACKGROUND

Inventive concepts relate to a magnetic memory device, and more particularly, to a magnetic memory device based on spin-orbit torque.

As electronic products trend toward high speed and/or low power consumption, high speed and low operating voltages are increasingly required or desired for semiconductor memory devices incorporated in the electronic products. In order to meet the expectations above, magnetic memory devices have been developed as semiconductor memory devices. Because magnetic memory devices operate at high speeds and have nonvolatile characteristics, they have attracted considerable attention as the next-generation semiconductor memory devices.

In general, the magnetic memory device may include a magnetic tunnel junction (MTJ). The magnetic tunnel junction may include two magnetic structures and a dielectric layer interposed therebetween. The resistance of the magnetic tunnel junction varies depending on magnetization directions of the two magnetic structures. For example, the magnetic tunnel junction has high resistance when the magnetization directions of the two magnetic structures are anti-parallel (pointing in opposite direction) and low resistance when the magnetization directions of the two magnetic structures are parallel (pointing in the same direction). The magnetic memory device may write and read data using the resistance difference between the high and low resistances of the magnetic tunnel junction. With the remarkable advance in electronic industry, there is an increasing demand or desire for high integration and/or low power consumption of magnetic memory devices. Accordingly, many studies have been conducted to at least partially meet these demands

SUMMARY

Some example embodiments of inventive concepts provide a spin-orbit torque-based magnetic memory device capable of easily achieving high integration.

Alternatively or additionally, some example embodiments of inventive concepts provide a spin-orbit torque-based magnetic memory device whose magnetic tunnel junction pattern has improved thermal stability.

According to some example embodiments of inventive concepts, a magnetic memory device may comprise a write word line and a read word line that extend in a first direction on a substrate, and are spaced apart from each other in a second direction, the first direction and the second direction intersecting each other and parallel to a bottom surface of the substrate; a plurality of first source/drain contacts on one side of the write word line and spaced apart from each other in the first direction; a plurality of second source/drain contacts on one side of the read word line and spaced apart from each other in the first direction; a plurality of magnetic tunnel junction patterns, each of the plurality of magnetic tunnel junction patterns correspondingly connected to a one of the plurality of the second source/drain contacts; and a plurality of spin-orbit torque lines, each of the plurality of spin-orbit torque lines correspondingly on a one of the plurality of magnetic tunnel junction patterns and are correspondingly connected to a one of the plurality of first source/drain contacts. The plurality of magnetic tunnel junction patterns may be spaced apart from each other in a third direction that is parallel to the bottom surface of the substrate and that intersects all of the first direction and the second direction. The plurality of spin-orbit torque lines may be spaced apart from each other in the third direction.

According to some example embodiments of inventive concepts, a magnetic memory device may comprise: a plurality of magnetic tunnel junction patterns on a substrate that are spaced apart from each other along a first direction and a second direction, the first direction and the second direction intersecting each other and parallel to a bottom surface of the substrate; and a plurality of spin-orbit torque lines, each of the plurality of spin-orbit torque lines corresponding on a one of the plurality of magnetic tunnel junction patterns and are spaced apart from each other along the first direction and the second direction. When viewed in a plan view, immediately neighboring ones of the plurality of magnetic tunnel junction patterns may be spaced apart from each other to reside at vertices of an imaginary polygon. Immediately neighboring ones of the spin-orbit torque lines may be spaced apart from each other to reside at the vertices of the imaginary polygon. Distances between the neighboring magnetic tunnel junction patterns may be the same as each other.

According to some example embodiments of inventive concepts, a magnetic memory device may comprise: a substrate that includes a plurality of first cell regions and a plurality of second cell regions, the plurality of first cell regions and second cell regions being alternately and repeatedly arranged along a first direction that is parallel to a bottom surface of the substrate; and a plurality of magnetic tunnel junction patterns that are correspondingly on the plurality of first cell regions and the plurality of second cell regions; and a plurality of spin-orbit torque lines that are correspondingly on the plurality of magnetic tunnel junction patterns and are correspondingly on the plurality of first cell regions and the second cell regions. The plurality of magnetic tunnel junction patterns may be arranged in a zigzag fashion along the first direction. The plurality of spin-orbit torque lines may be arranged in a zigzag fashion along the first direction.

DETAIL PORTIONED DESCRIPTION OF VARIOUS EXAMPLE EMBODIMENTS

The following will now describe in detail some example embodiments of inventive concepts with reference to the accompanying drawings.

Figure 1:
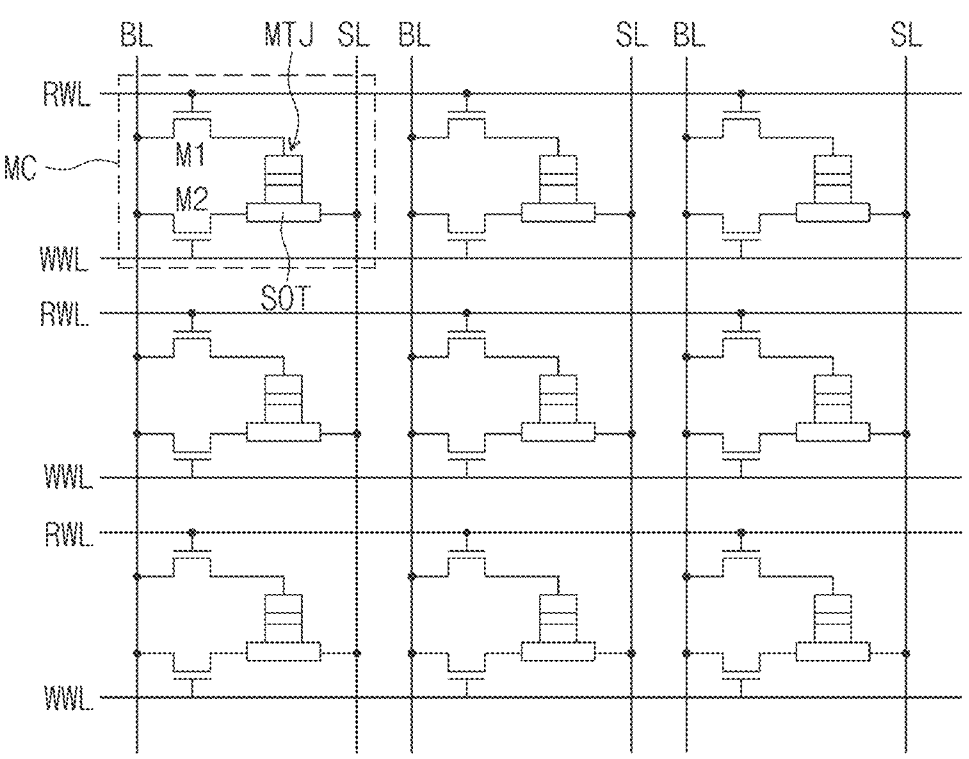
FIG. 1 illustrates a circuit diagram showing a cell array of a magnetic memory device according to some example embodiments of inventive concepts.
Figure 2:
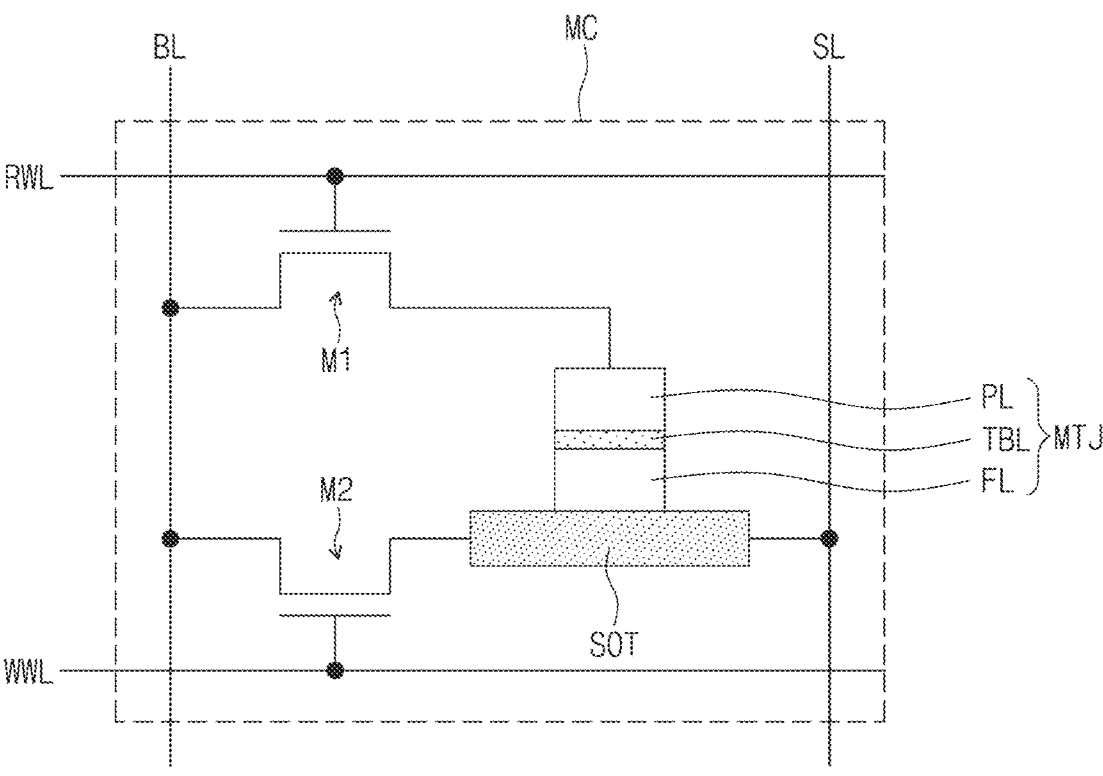
FIG. 2 illustrates a simplified circuit diagram showing a memory cell of a magnetic memory device according to some example embodiments of the present inventive concept.

FIG. 1 illustrates a circuit diagram showing a cell array of a magnetic memory device according to some example embodiments of inventive concepts. FIG. 2 illustrates a simplified circuit diagram showing a memory cell of a magnetic memory device according to some example embodiments of the present inventive concept.

Referring to FIGS. 1 and 2, a cell array may include a plurality of write word lines WWL, a plurality of read word lines RWL, a plurality of bit lines BL, a plurality of source lines SL, and a plurality of memory cells MC.

Each of the memory cells MC may include a magnetic tunnel junction pattern MTJ, a spin-orbit torque line SOT, a read transistor M1, and a write transistor M2.

The spin-orbit torque line SOT may have a first edge portion connected to a first source/drain terminal of the write transistor M2, and may also have a second edge portion connected to a corresponding one of the source lines SL. The magnetic tunnel junction pattern MTJ may be disposed on the spin-orbit torque line SOT between the first edge portion and the second edge portion. The magnetic tunnel junction pattern MTJ may include a pinned magnetic pattern PL, a free magnetic pattern FL, and a tunnel barrier pattern TBL between the pinned and free magnetic patterns PL and FL. The free magnetic pattern FL may be disposed between the spin-orbit torque line SOT and the tunnel barrier pattern TBL, and the pinned magnetic pattern PL may be spaced apart from the free magnetic pattern FL across the tunnel barrier pattern TBL. The free magnetic pattern FL may be in contact with one surface of the spin-orbit torque line SOT. When an in-plane current flows through the spin-orbit torque line SOT, the free magnetic pattern FL may be provided with spin-orbit torque induced by a spin Hall effect and/or a Rashba effect, and thus a magnetization direction of the free magnetic pattern FL may be changed.

The magnetic tunnel junction pattern MTJ may be disposed between the spin-orbit torque line SOT and a second source/drain terminal of the read transistor M1, and may be connected to the second source/drain terminal of the read transistor M1. The read transistor M1 and the write transistor M2 may have their third source/drain terminals that are connected in common to a corresponding one of the bit lines BL.

The read transistor M1 may be connected between the magnetic tunnel junction pattern MTJ and the corresponding bit line BL, and a gate electrode of the read transistor M1 may be connected to a corresponding one of the read word lines RWL. The read transistor M1 may control an electrical connection between the magnetic tunnel junction pattern MTJ and the corresponding bit line BL. The write transistor M2 may be connected between the corresponding bit line BL and the first edge portion of the spin-orbit torque line SOT, and a gate electrode of the write transistor M2 may be connected to a corresponding one of the write word lines WWL. The write transistor M2 may control an electrical connection between the spin-orbit torque line SOT and the corresponding bit line BL. Either or both of the read transistor M1 and the write transistor M2 may be planar transistors, and/or may be NMOS transistors; however, example embodiments are not limited thereto. Electrical characteristics of the read transistor M1, such as but not limited to threshold voltages and/or driver currents, may be the same as, or may be different from, corresponding electrical characteristics of the write transistor M2.

The memory cells MC may be arranged along a plurality of rows (or, word lines) and a plurality of columns (or, bit lines). The memory cell MC in each row may be connected to a corresponding one of the write word lines WWL and a corresponding one of the read word lines RWL. The memory cells MC in each column may be connected to a corresponding one of the bit lines BL and a corresponding one of the source lines SL.

The read transistors M1 of the memory cells MC in each row may be connected in common to the corresponding read word line RWL, and the write transistors M2 of the memory cells MC in each column may be connected in common to the corresponding write word line WWL. The spin-orbit torque lines SOT of the memory cells MC in each column may be connected in common to the corresponding source line SL, and the read and write transistors M1 and M2 of the memory cells MC in each column may be connected in common to the corresponding bit line BL.

When a write operation is performed on selected memory cells, the write transistor M2 may be turned on through the write word line WWL, and the read transistor M1 may be turned off, e.g. simultaneously or concurrently with the write transistor M2 being on. Therefore, a write current may flow through the spin-orbit torque line SOT. The write current may have a current direction that is changed based on conditions of voltages, e.g. magnitudes and/or polarities, applied to a selected bit line BL and a corresponding source line SL.

The write current may be an in-plane current that provides spin-orbit torque to the free magnetic pattern FL of the magnetic tunnel junction pattern MTJ. The write current may flow parallel and adjacent to an interface between the spin-orbit torque line SOT and the free magnetic pattern FL. During the flow of the write current, a spin Hall effect and/or a Rashba effect may cause a spin current to flow in a direction perpendicular to the interface between the spin-orbit torque line SOT and the free magnetic pattern FL, and thus spin-orbit torque may be applied to the magnetic tunnel junction pattern MTJ. Accordingly, a magnetization direction of the free magnetic pattern FL may be switched to be anti-parallel (or, alternatively, parallel) to that of the pinned magnetic pattern PL.

When a read operation is performed on selected memory cells, the read transistor M1 may be turned on through the read word line RWL, and the write transistor M2 may be turned off, e.g. simultaneously or concurrently with the read transistor M1 being on. In a read operation, a read current may flow from a corresponding bit line BL toward a corresponding source line SL. The read current may flow through the magnetic tunnel junction pattern MTJ and the spin-orbit torque line SOT. The read current may flow through the magnetic tunnel junction pattern MTJ in a direction perpendicular to an interface where the spin-orbit torque line SOT and the magnetic tunnel junction pattern MTJ are in contact with each other.

Figure 3A:
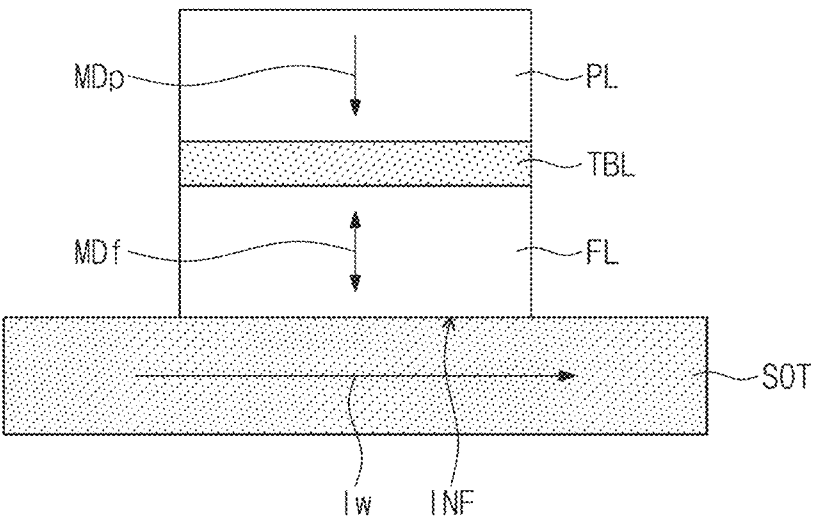
FIGS. 3A and 3B illustrate cross-sectional views showing an example of a magnetic tunnel junction pattern included in the memory cell of FIG. 2.
Figure 3B:
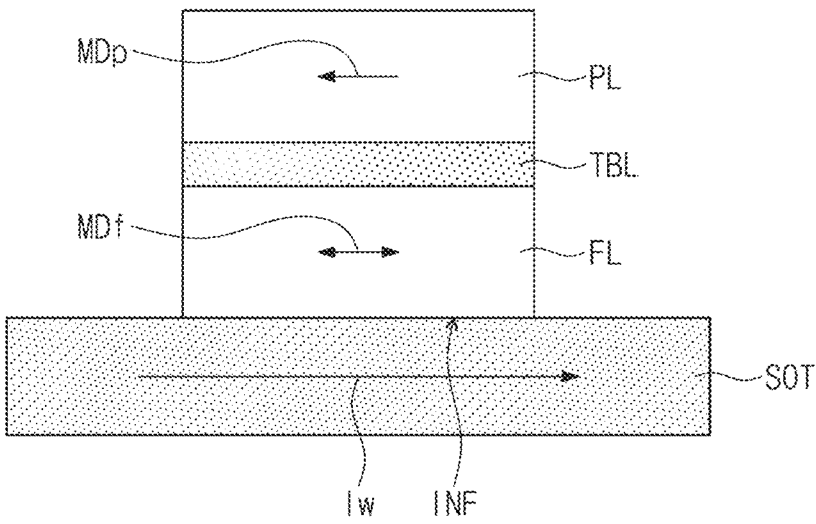

FIGS. 3A and 3B illustrate cross-sectional views showing examples of a magnetic tunnel junction pattern included in the memory cell of FIG. 2.

Referring to FIGS. 3A and 3B, the magnetic tunnel junction pattern MTJ may include the free magnetic pattern FL, the tunnel barrier pattern TBL, and the pinned magnetic pattern PL that are sequentially stacked on the spin-orbit torque line SOT. The pinned magnetic pattern PL may have a magnetization direction MDp that is fixed to one direction, and the free magnetic pattern FL may have a magnetization direction MDf that is capable of being changed to be parallel or anti-parallel to the magnetization direction MDp of the pinned magnetic pattern PL. As discussed with reference to FIGS. 1 and 2, a write current Iw may flow through the spin-orbit torque line SOT, and may flow parallel and adjacent to an interface INF between the spin-orbit torque line SOT and the free magnetic pattern FL. The magnetic tunnel junction pattern MTJ may be provided with spin-orbit torque induced by the write current Iw, and thus the magnetization direction MDf of the free magnetic pattern FL may be switched to be anti-parallel (or, alternatively, parallel) to the magnetization direction MDp of the pinned magnetic pattern PL.

Referring to FIG. 3A, the magnetization directions MDf and MDp of the free and pinned magnetic patterns FL and PL may be perpendicular to the interface INF between the spin-orbit torque line SOT and the free magnetic pattern FL. The free magnetic pattern FL and the pinned magnetic pattern PL may have perpendicular magnetic anisotropy. In this case, each of the free magnetic pattern FL and the pinned magnetic pattern PL may include at least one selected from an intrinsic perpendicular magnetization material and an extrinsic perpendicular magnetization material. The intrinsic perpendicular magnetization material may include a material having a perpendicular magnetization property found even in the absence of an external factor. The intrinsic perpendicular magnetization material may include at least one selected from a perpendicular magnetic material (e.g., one or more of CoFeTb, CoFeGd, CoFeDy), a perpendicular magnetic material having an L10 structure, CoPt of a hexagonal close packed (HCP) lattice structure, and a perpendicular magnetization structure. The perpendicular magnetic material having the L10 structure may include at least one selected from FePt of the L10 structure, FePd of the L10 structure, CoPd of the L10 structure, and CoPt of the L10 structure. The perpendicular magnetization structure may include magnetic layers and non-magnetic layers that are alternately and repeatedly stacked. For example, the perpendicular magnetization structure may include at least one selected from (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where, n is the number of stacked layers). The extrinsic perpendicular magnetization material may include a material having an intrinsic horizontal magnetization property or a perpendicular magnetization property caused by an external factor. For example, the extrinsic perpendicular magnetization material may have the perpendicular magnetization property caused by magnetic anisotropy induced by a junction between the tunnel barrier pattern TBL and the free magnetic pattern FL (or the pinned magnetic pattern PL). The extrinsic perpendicular magnetization material may include, for example, CoFeB.

Referring to FIG. 3B, the magnetization directions MDf and MDp of the free and pinned magnetic patterns FL and PL may be parallel to the interface INF between the spin-orbit torque line SOT and the free magnetic pattern FL. The free magnetic pattern FL and the pinned magnetic pattern PL may have in-plane magnetic anisotropy. In this case, each of the free magnetic pattern FL and the pinned magnetic pattern PL may include a ferromagnetic material. The pinned magnetic pattern PL may further include an anti-ferromagnetic material that fixes a magnetization direction of the ferromagnetic material in the pinned magnetic pattern PL.

According to some example embodiments, each of the free magnetic pattern FL and the pinned magnetic pattern PL may include a Co-based Heusler alloy. The tunnel barrier pattern TBL may include at least one selected from a magnesium (Mg) oxide layer, a titanium (Ti) oxide layer, an aluminum (Al) oxide layer, a magnesium-zinc (Mg—Zn) oxide layer, and a magnesium-boron (Mg—B) oxide layer.

The spin-orbit torque line SOT may include a heavy metal or a material doped with a heavy metal. For example, the spin-orbit torque line SOT may include at least one selected from "A" and "M" which is doped with "B". Here, "A" may include one or more of yttrium (Y), zirconium (Zr), niobium (Nb), molybdenum (Mo), technetium (Tc), ruthenium (Ru), rhodium (Rh), palladium (Pd), cadmium (Cd), indium (In), antimony (Sb), tellurium (Te), hafnium (Hf), tantalum (Ta) which includes high-resistance amorphous β-Ta, tungsten (W), rhenium (Re), osmium (Os), iridium (Ir), platinum (Pt), gold (Au), mercury (Hg), thallium (Tl), lead (Pb), bismuth (Bi), polonium (Po), astatine (At), and any combination thereof. Additionally, "B" may include at least one selected from vanadium (V), chromium (Cr), manganese (Mn), iron (Fe), cobalt (Co), nickel (Ni), phosphorus (P), sulfur (S), zinc (Zn), gallium (Ga), germanium (Ge), arsenic (As), selenium (Se), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), antimony (Sb), tellurium (Te), iodine (I), lutetium (Lu), hafnium (Hf), tantalum (Ta), tungsten (W), rhenium (Re), osmium (Os), iridium (Ir), platinum (Pt), gold (Au), mercury (Hg), thallium (Tl), lead (Pb), bismuth (Bi), polonium (Po), astatine (At), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), and ytterbium (Yb). Further "M" may include at least one selected from aluminum (Al), titanium (Ti), vanadium (V), chromium (Cr), manganese (Mn), copper (Cu), zinc (Zn), silver (Ag), hafnium (Hf), tantalum (Ta), tungsten (W), rhenium (Re), platinum (Pt), gold (Au), mercury (Hg), lead (Pb), silicon (Si), gallium (Ga), gallium-manganese (GaMn), and gallium-arsenic (GaAs).

The spin-orbit torque line SOT may include a chalcogen-based topological insulator. The spin-orbit torque line SOT may include a compound in which at least one of chalcogen elements, tellurium (Te) and selenium (Se), is combined with at least one selected from silicon (Si), germanium (Ge), bismuth (Bi), and antimony (Sb). The spin-orbit torque line SOT may include, for example, at least one selected from GeSe, BiSe, BiSbTe, GeTe, GeTeSe, GeSbTe, SiTe, and SiGeTe.

Figure 4:
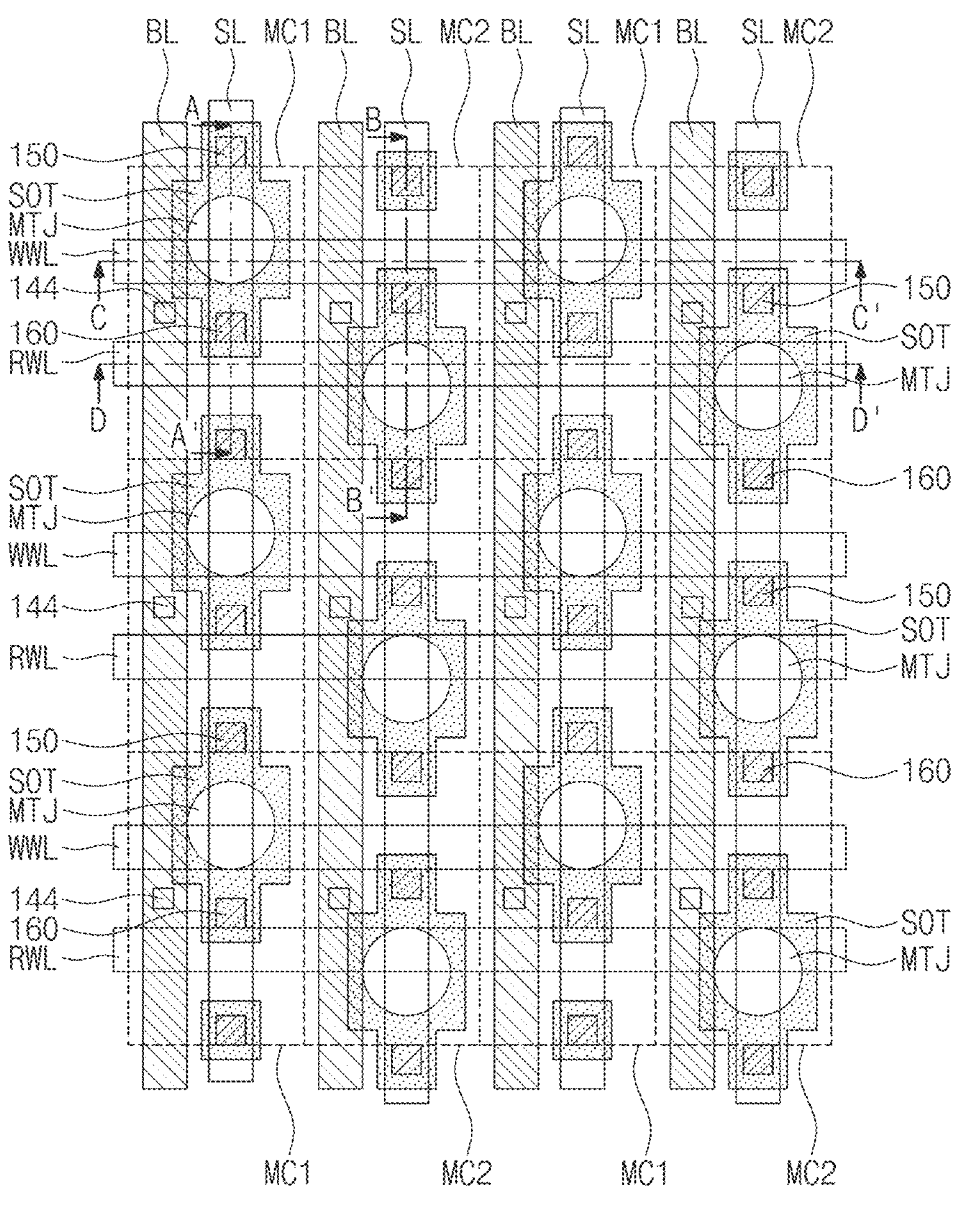
FIG. 4 illustrates a plan view showing a magnetic memory device according to some example embodiments of inventive concepts.
Figure 4:
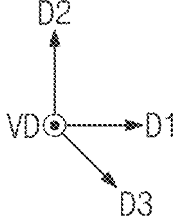
Figure 5:
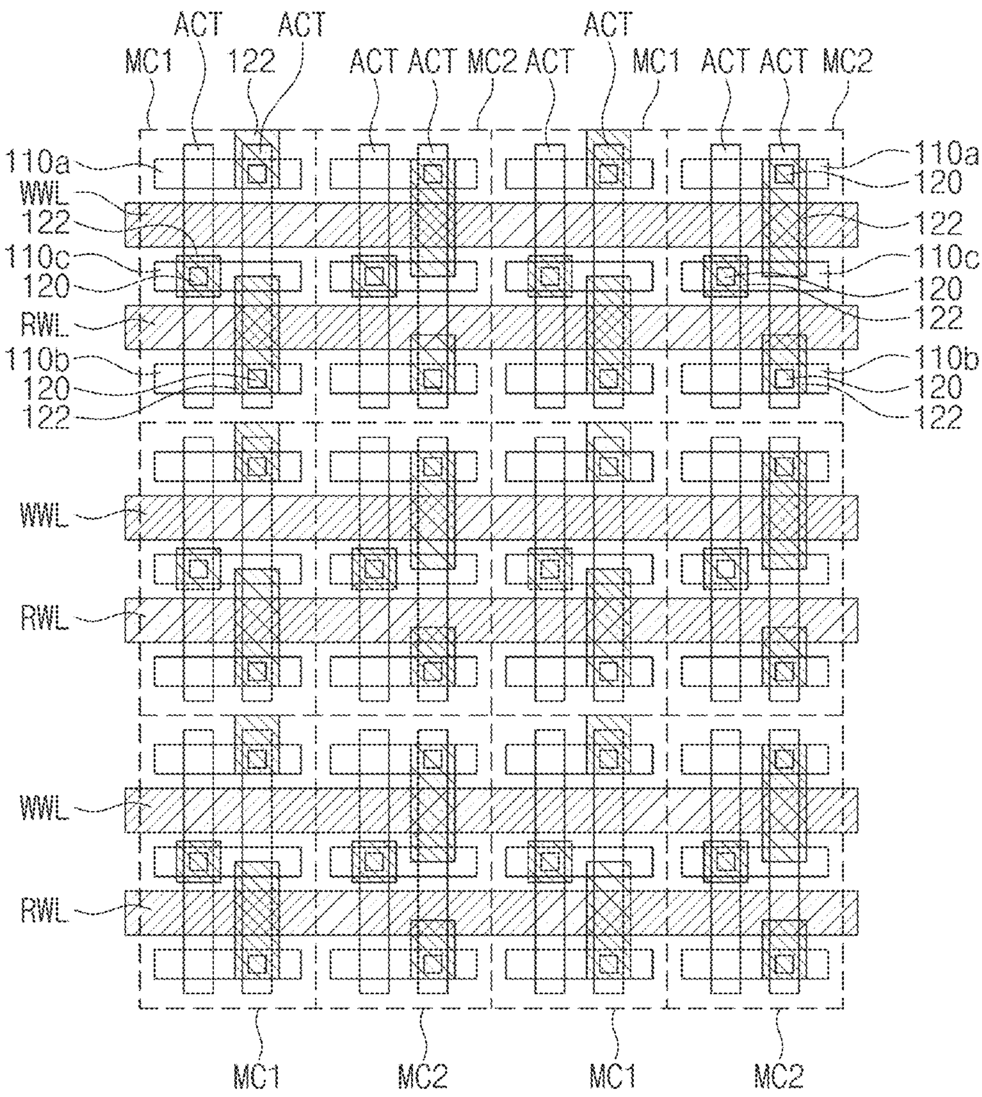
FIG. 5 illustrates a plan view showing first wiring patterns of the magnetic memory device depicted in FIG. 4.
Figure 5:
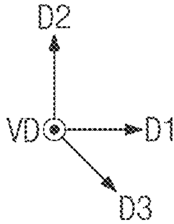
Figure 6:
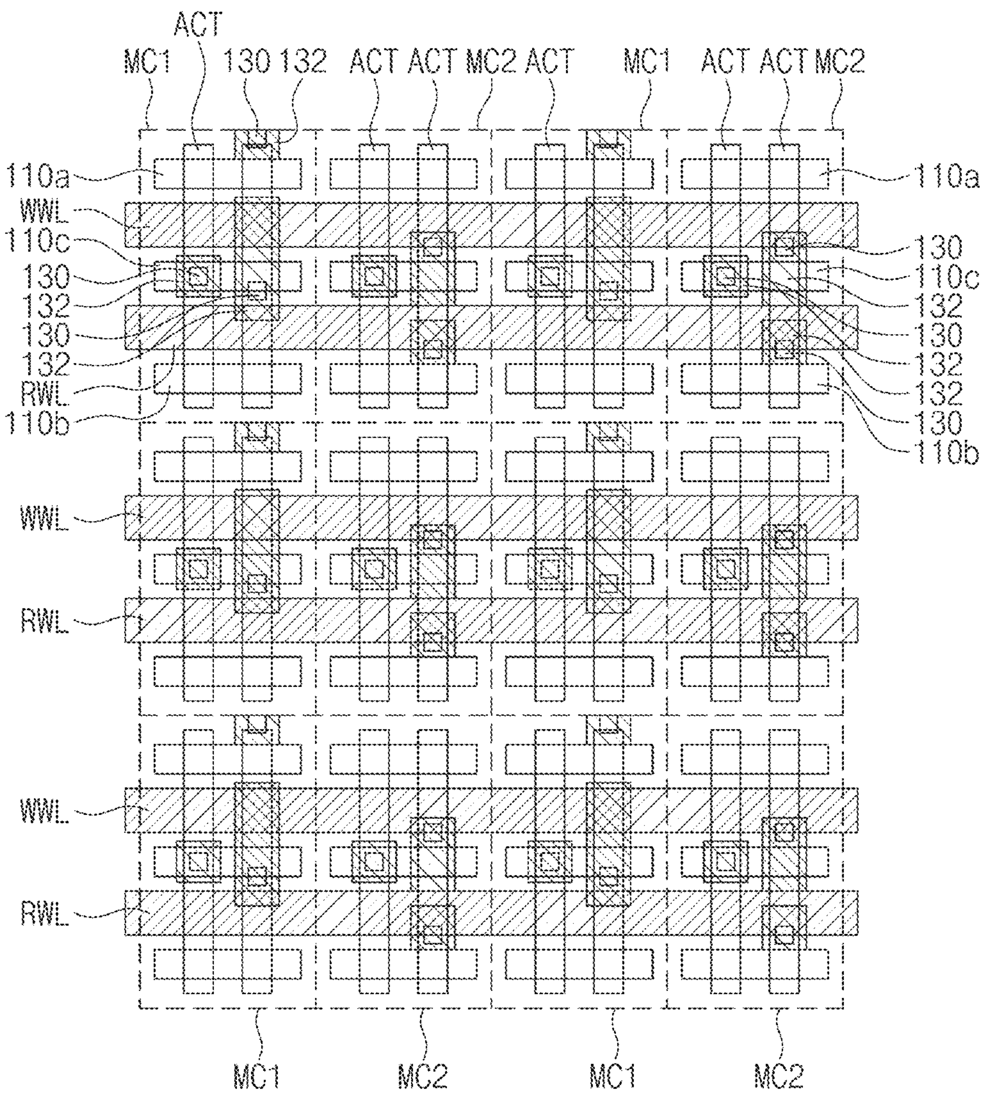
FIG. 6 illustrates a plan view showing second wiring patterns of the magnetic memory device depicted in FIG. 4.
Figure 6:
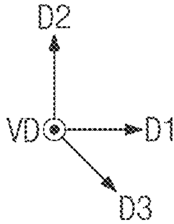
Figure 7:
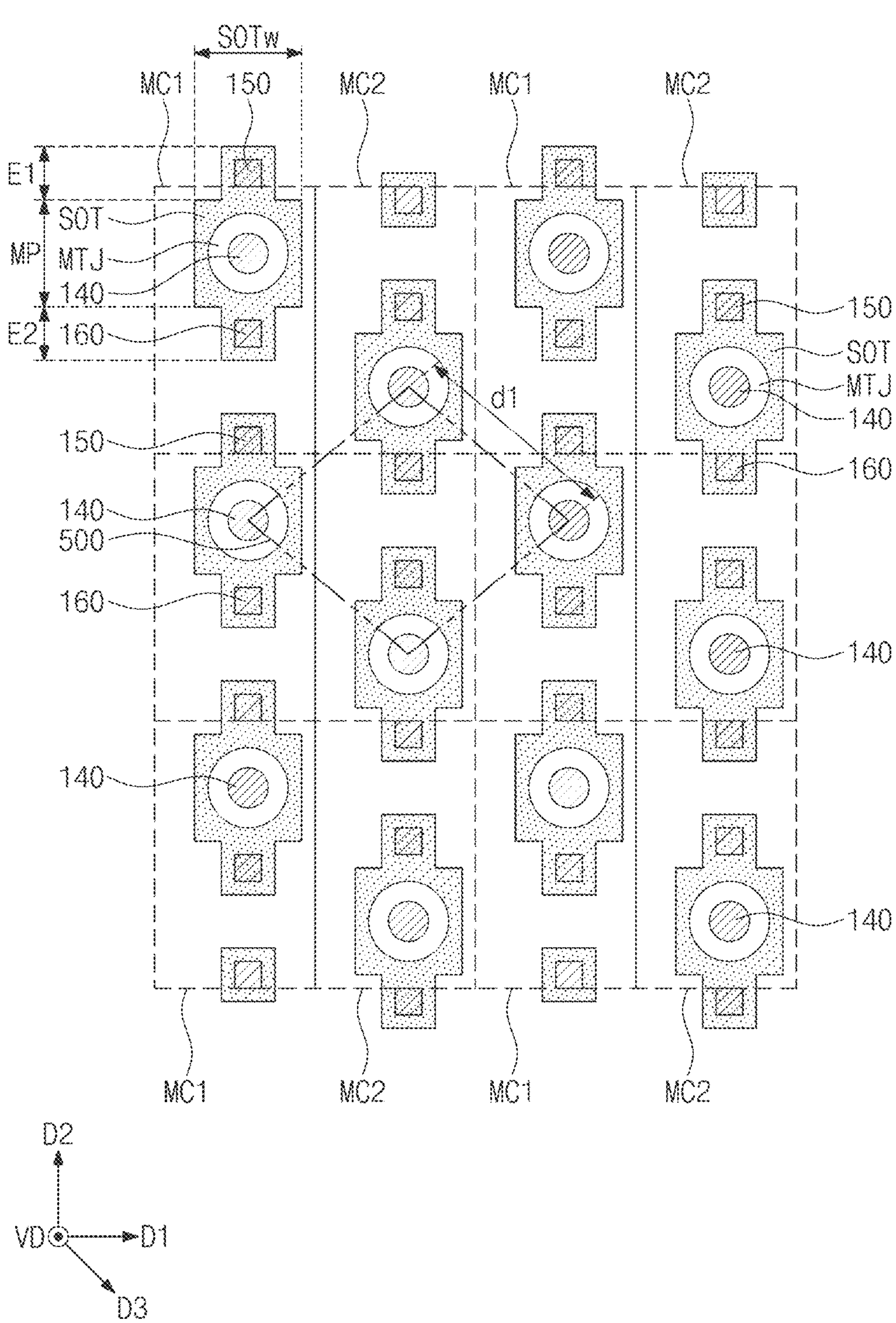
FIG. 7 illustrates a plan view showing an arrangement of magnetic tunnel junction patterns and spin-orbit torque lines of the magnetic memory device depicted in FIG. 4.
Figure 8A:
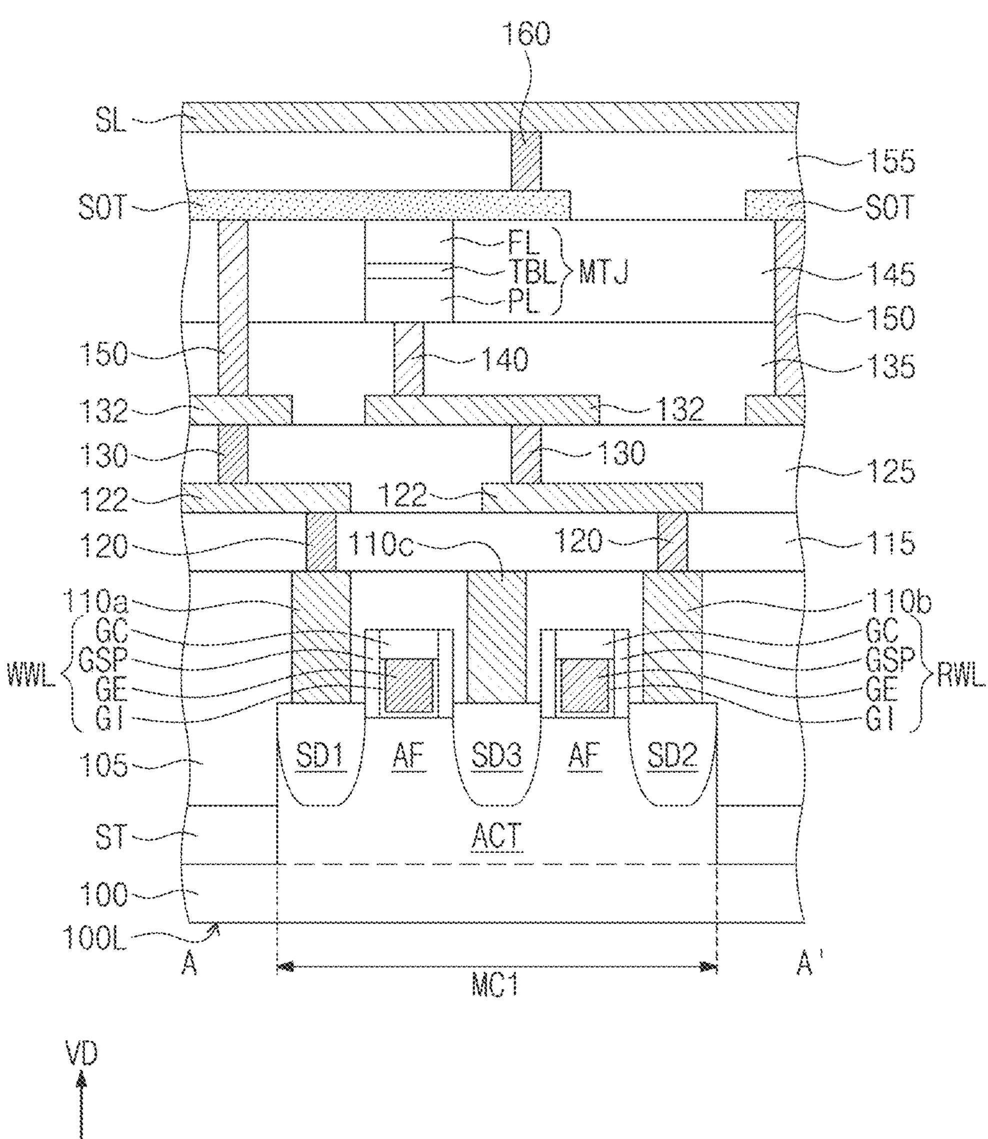
FIGS. 8A, 8B, 8C, and 8D illustrate cross-sectional views respectively taken along lines A-A', B-B', C-C', and D-D' of FIG. 4.
Figure 8B:
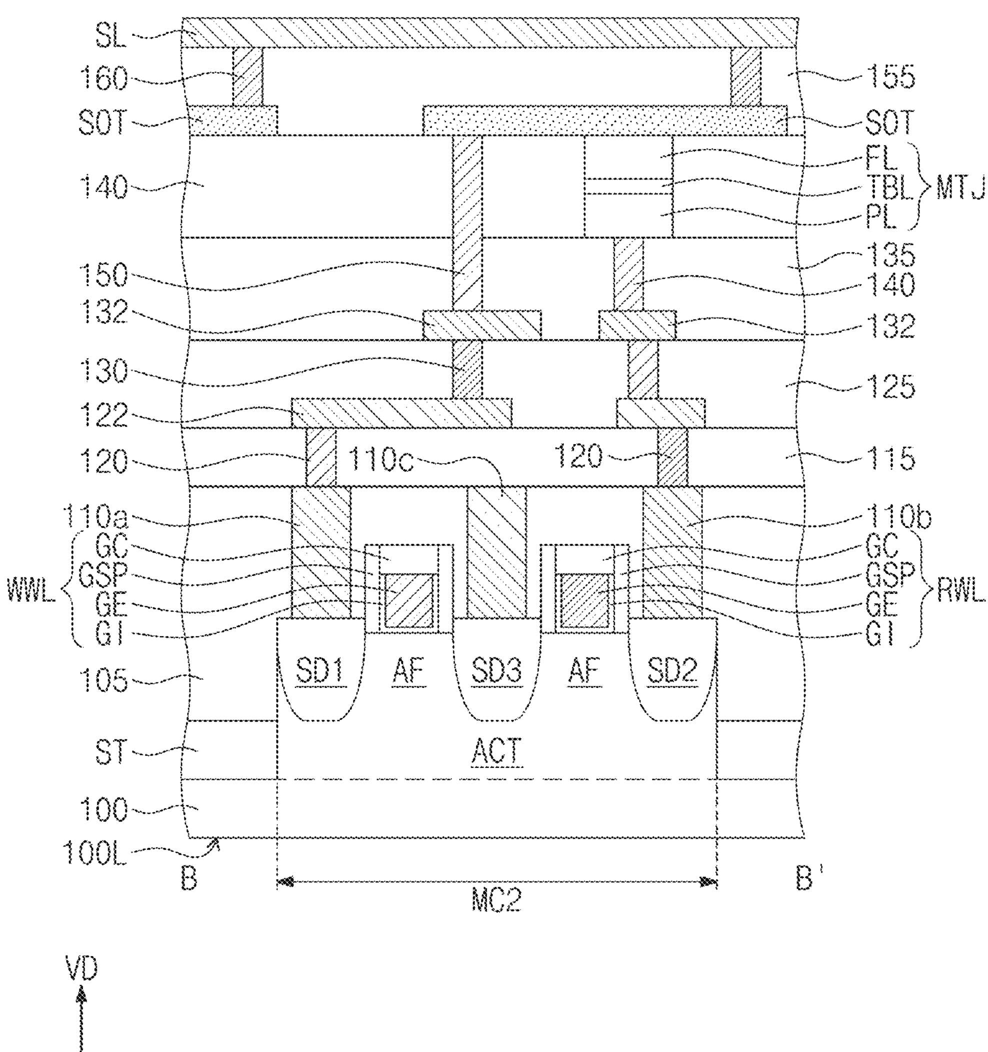
Figure 8C:
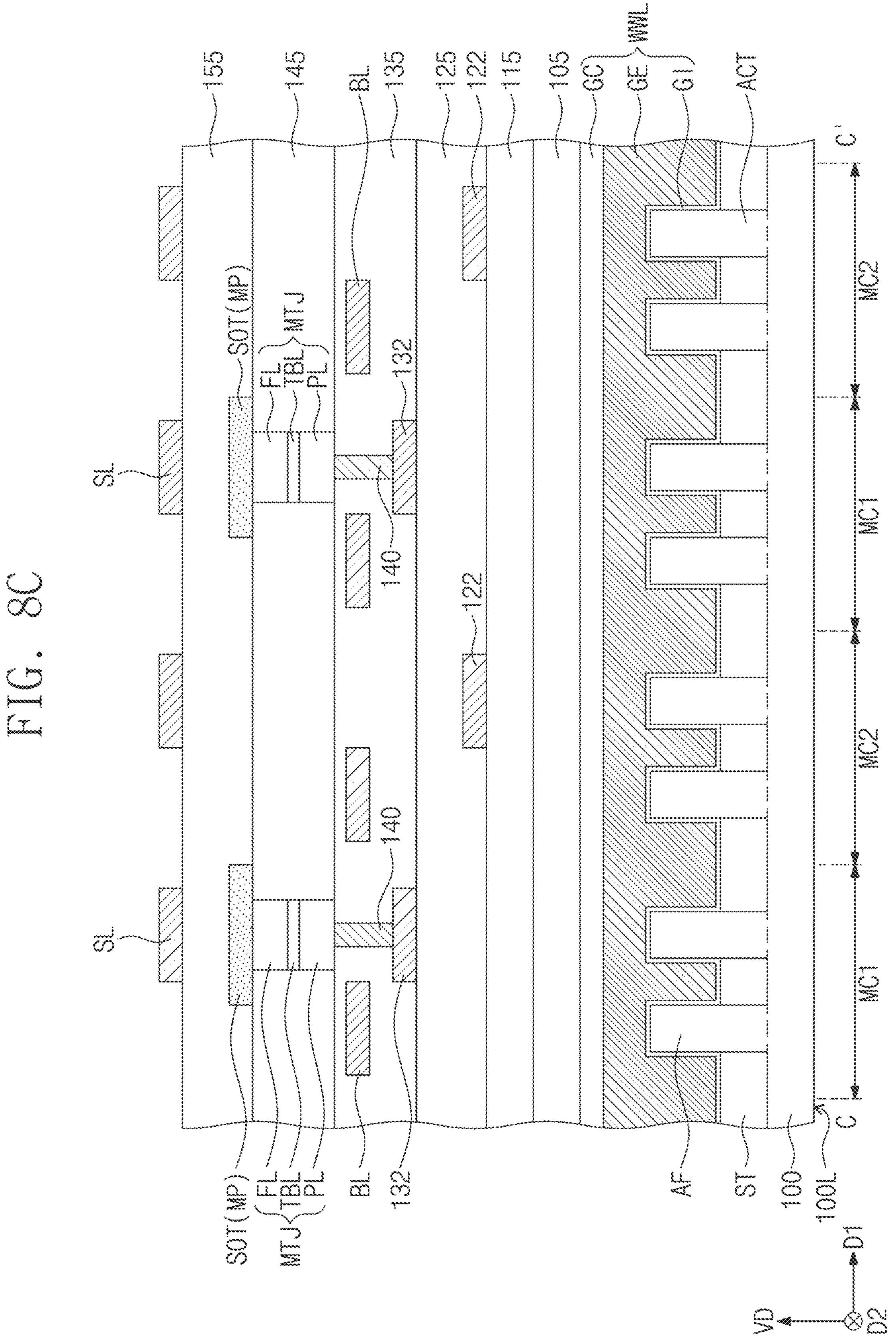
Figure 8D:
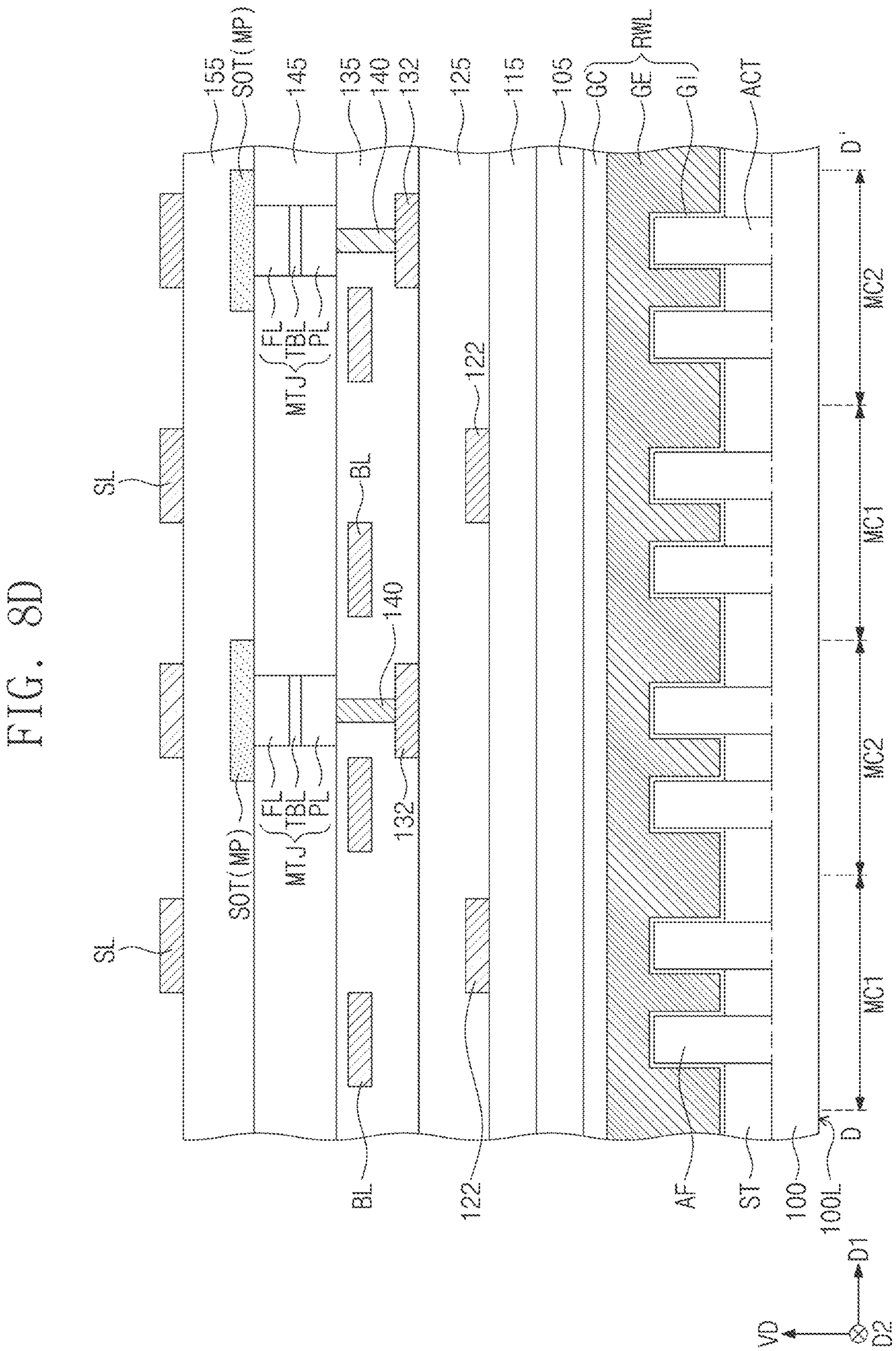

FIG. 4 illustrates a plan view showing a magnetic memory device according to some example embodiments of inventive concepts. FIG. 5 illustrates a plan view showing first wiring patterns of the magnetic memory device depicted in FIG. 4. FIG. 6 illustrates a plan view showing second wiring patterns of the magnetic memory device depicted in FIG. 4. FIG. 7 illustrates a plan view showing an arrangement of magnetic tunnel junction patterns and spin-orbit torque lines of the magnetic memory device depicted in FIG. 4. FIGS. 8A, 8B, 8C, and 8D illustrate cross-sectional views respectively taken along lines A-A', B-B', C-C', and D-D' of FIG. 4.

Referring to FIGS. 4, 5, and 8A to 8D, a substrate 100 may be provided. The substrate 100 may include first cell regions MC1 and second cell regions MC2. The substrate 100 may be or may include a semiconductor substrate, such as one or more of a silicon substrate, a germanium substrate, and a silicon-germanium substrate. The first cell regions MC1 and the second cell regions MC2 may be two-dimensionally arranged in a first direction D1 and a second direction D2 that are parallel to a bottom surface 100L of the substrate and that intersect each other (for example that are orthogonal to each other). Ones arranged in the first direction D1 of the first cell regions MC1 may be arranged alternately and repeatedly with ones arranged in the first direction D1 of the second cell regions MC2. Ones arranged in the second direction D2 of the first cell regions MC1 may be immediately adjacent to each other in the second direction D2, and ones arranged in the second direction D2 of the second cell regions MC2 may be immediately adjacent to each other in the second direction D2.

Active patterns ACT may be disposed on the substrate 100 of each of the first and second cell regions MC1 and MC2. The active patterns ACT may be spaced apart from each other in the first direction D1 and may extend in the second direction D2. Each of the active patterns ACT may protrude from the substrate 100 along a vertical direction VD relative to (e.g., above) the bottom surface 100L of the substrate 100. Each of the active patterns ACT may be or may include a portion of the substrate 100, which portion protrudes along the vertical direction VD from the substrate 100.

The substrate 100 may be provided thereon with device isolation patterns ST that cover lateral surfaces of each of the active patterns ACT. Each of the active patterns ACT may have an upper portion (referred to hereinafter as an active fin AF) exposed by the device isolation patterns ST. The active fin AF of each of the active patterns ACT may upwardly protrude from top surfaces of the device isolation patterns ST. The top surfaces of the device isolation patterns ST may be located at a lower height than that of a top surface of the active fin AF of each of the active patterns ACT. As used herein, the term "height" may be a distance measured in the vertical direction VD from the bottom surface 100L of the substrate 100. The device isolation patterns ST may include, for example, one or more of a silicon oxide layer, a silicon nitride layer, or a silicon oxynitride layer.

The substrate 100 may be provided thereon with a write word line WWL and a read word line RWL that run across the active patterns ACT and the device isolation patterns ST. The write word line WWL and the read word line RWL may extend in the first direction D1 and may be spaced apart from each other in the second direction D2. The write word line WWL and the read word line RWL may run across the active patterns ACT on the first cell regions MC1 and the second cell regions MC2 that are alternately arranged along the first direction D1. Each of the write and read word lines WWL and RWL may cover the top and lateral surfaces of the active fin AF of each of the active patterns ACT and may extend onto the top surfaces of the device isolation patterns ST.

Each of the write and read word lines WWL and RWL may include a gate electrode GE that extends in the first direction D1, a gate dielectric pattern GI that extends in the first direction D1 along a bottom surface of the gate electrode GE, a gate capping pattern GC that extends in the first direction D1 along a top surface of the gate electrode GE, and gate spacers GSP on lateral surfaces of the gate electrode GE. The write word lines WWL may include the same, or different components than those of the read word lines RWL, and may have the same, or different geometries from those of the read word lines RWL. The gate electrode GE may run across the active patterns ACT on the first cell regions MC1 and the second cell regions MC2 that are alternately arranged along the first direction D1, and may cover the top and lateral surfaces of the active fin AF of each of the active patterns ACT. The gate electrode GE may extend onto the top surfaces of the device isolation patterns ST. The gate dielectric pattern GI may be interposed between the gate electrode GE and the active fin AF of each of the active patterns ACT, and may extend between the gate electrode GE and the top surfaces of the device isolation patterns ST. The gate dielectric pattern GI may extend between the gate spacers GSP and the lateral surfaces of the gate electrode GE. The gate dielectric pattern GI may have an uppermost surface located at substantially the same height as that of the top surface of the gate electrode GE. The gate capping pattern GC may cover the top surface of the gate electrode GE and the uppermost surface of the gate dielectric pattern GI, and may be interposed between the gate spacers GSP.

The gate electrode GE may include one or more of doped semiconductors (such as polysilicon doped with one or more of boron, arsenic, or phosphorus), conductive metal nitride, and metal. The gate dielectric pattern GI may include at least one selected from a silicon oxide layer, a silicon nitride layer, a silicon oxynitride layer, and a high-k dielectric layer. The high-k dielectric layer may include a material, such as hafnium oxide (HfO), aluminum oxide (AlO), or tantalum oxide (TaO), whose dielectric constant is greater than that of a silicon oxide layer. The gate spacers GSP and the gate capping pattern GC may each include at least one selected from a silicon oxide layer, a silicon nitride layer, and a silicon oxynitride layer.

Source/drain patterns SD1, SD2, and SD3 may be disposed on each of the first and second cell regions MC1 and MC2 and on the active patterns ACT. The source/drain patterns SD1, SD2, and SD3 may include first source/drain patterns SD1 disposed on the active patterns ACT on one side of the write word line WWL, second source/drain patterns SD2 disposed on the active patterns ACT on one side of the read word line RWL, and third source/drain patterns SD3 disposed on the active patterns ACT between the write word line WWL and the read word line RWL. The first source/drain patterns SD1 on the first cell regions MC1 and the second cell regions MC2 that are alternately arranged along the first direction D1 may be spaced apart from each other in the first direction D1 on the one side of the write word line WWL. The second source/drain patterns SD2 on the first cell regions MC1 and the second cell regions MC2 that are alternately arranged along the first direction D1 may be spaced apart from each other in the first direction D1 on the one side of the read word line RWL. The third source/drain patterns SD3 on the first cell regions MC1 and the second cell regions MC2 that are alternately arranged along the first direction D1 may be spaced apart from each other in the first direction D1 between the write word line WWL and the read word line RWL. Doping concentrations and/or dopant profiles of the first source drain pattern SD1, the second source drain pattern SD2, and the third source drain pattern SD3 may be the same as, or different from, each other.

The source/drain patterns SD1, SD2, and SD3 may be or may include epitaxial patterns, e.g. patterns that are formed by using the active patterns ACT as seed layers. The source/drain patterns SD1, SD2, and SD3 may together or independently include at least one selected from silicon-germanium (SiGe), silicon (Si), and silicon carbide (SiC). The source/drain patterns SD1, SD2, and SD3 may be configured to provide the active fins AF of the active patterns ACT with tensile strain or compressive strain. The source/drain patterns SD1, SD2, and SD3 may further include p-type impurities (e.g., boron (B)) and/or n-type impurities (e.g., phosphorus (P) and/or arsenic (As)). The impurities may be implanted, and/or may be incorporated during the epitaxial growth.

On each of the first and second cell regions MC1 and MC2, the active patterns ACT may include active fins AF that overlap vertically (e.g., in the vertical direction VD) with the write word line WWL. The active fins AF may be interposed between the first source/drain patterns SD1 and the third source/drain patterns SD3. The write word line WWL, the first source/drain patterns SD1, and the third source/drain patterns SD3 may constitute or correspond to the write transistor M2 discussed with reference to FIGS. 1 and 2, and the active fin AF may serve as a channel of the write transistor M2. The write transistor M2 may be a fin field effect transistor, but example embodiments are not limited thereto. The write transistor M2 may be configured as a gate-all-around (GAA) or multi-bridge channel field effect transistor (MBCFET™).

On each of the first cell regions MC1 and the second cell regions MC2, the active patterns ACT may further include additional active fins AF that overlap vertically (e.g., in the vertical direction VD) with the read word line RWL. The additional active fins AF may be interposed between the second source/drain patterns SD2 and the third source/drain patterns SD3. The read word line RWL, the second source/drain patterns SD2, and the third source/drain patterns SD3 may constitute or correspond to the read transistor M1 discussed with reference to FIGS. 1 and 2, and the additional active fin AF may serve as a channel of the read transistor M1. The read transistor M1 may be a fin field effect transistor, but example embodiments are not limited thereto. The read transistor M1 may be configured as a gate-all-around (GAA) or multi-bridge channel field effect transistor (MBCFET™).

Source/drain contacts 110*a*, 110*b*, and 110*c* may be disposed on each of the first and second cell regions MC1 and MC2 and on the source/drain patterns SD1, SD2, and SD3. The source/drain contacts 110*a*, 110*b*, and 110*c* may include first source/drain contacts 110*a* connected to the first source/drain patterns SD1 on the one side of the write transistor WWL, second source/drain contacts 110*b* connected to the second source/drain patterns SD2 on the one side of the read word line RWL, and third source/drain contacts 110*c* connected to the third source/drain patterns SD3 between the write word line WWL and the read word line RWL. On each of the first and second cell regions MC1 and MC2, each of the first, second, and third source/drain contacts 110*a*, 110*b*, and 110*c* may have a bar shape (e.g. a non-square rectangular and/or elliptical shape) that extends in the first direction D1, and each of the first, second, and third source/drain contacts 110*a*, 110*b*, and 110*c* may be congruent with each other, or alternatively at least one of the first through third source/drain contacts 110*a*, 110*b*, and 110*c* may not be congruent with others of the first through third source/drain contacts 110*a*, 110*b*, and 110*c*. The first source/drain contacts 110*a* on the first cell regions MC1 and the second cell regions MC2 that are alternately arranged along the first direction D1 may be spaced apart from each other in the first direction D1 on the one side of the write word line WWL. The second source/drain contacts 110*b* on the first cell regions MC1 and the second cell regions MC2 that are alternately arranged along the first direction D1 may be spaced apart from each other in the first direction D1 on the one side of the read word line RWL. The third source/drain contacts 110*c* on the first cell regions MC1 and the second cell regions MC2 that are alternately arranged along the first direction D1 may be spaced apart from each other in the first direction D1 between the write word line WWL and the read word line RWL.

The source/drain contacts 110*a*, 110*b*, and 110*c* may independently or collectively include one or more of metal, such as tungsten, titanium, tantalum, and cobalt, and conductive metal nitride, such as titanium nitride, tantalum nitride, and tungsten nitride.

The substrate 100 may be provided thereon with a first interlayer dielectric layer 105 that covers the write and read word lines WWL and RWL, the source/drain patterns SD1, SD2, and SD3, and the source/drain contacts 110*a*, 110*b*, and 110*c*. The source/drain contacts 110*a*, 110*b*, and 110*c* may penetrate the first interlayer dielectric layer 105 to come into connection with the source/drain patterns SD1, SD2, and SD3. The first interlayer dielectric layer 105 may have a top surface that is coplanar with those of the source/drain contacts 110*a*, 110*b*, and 110*c* and is located at substantially the same height as that of top surfaces of the source/drain contacts 110*a*, 110*b*, and 110*c*. The first interlayer dielectric layer 105 may include, for example, one or more of silicon oxide, silicon nitride, and silicon oxynitride.

The first interlayer dielectric layer 105 may be provided thereon with a second interlayer dielectric layer 115 that covers the top surfaces of the source/drain contacts 110*a*, 110*b*, and 110*c*. The second interlayer dielectric layer 115 may include, for example, one or more of silicon oxide, silicon nitride, and silicon oxynitride.

First wiring contacts 120 and first wiring lines 122 may be disposed in or on the second interlayer dielectric layer 115 on each of the first and second cell regions MC1 and MC2. The first wiring contacts 120 may penetrate the second interlayer dielectric layer 115 to come into connection with corresponding first, second, and third source/drain contacts 110*a*, 110*b*, and 110*c*. The first wiring lines 122 may be disposed on the second interlayer dielectric layer 115 and correspondingly connected to the first wiring contacts 120. The first wiring lines 122 may be correspondingly electrically connected through the first wiring contacts 120 to the first, second, and third source/drain contacts 110*a*, 110*b*, and 110*c*.

Each of the first wiring lines 122 may extend in the second direction D2 on the second interlayer dielectric layer 115. On each of the first cell regions MC1, one of the first wiring lines 122 that is connected to the second source/drain contact 110*b* may be elongated in the second direction D2 and may run across the read word line RWL. On each of the second cell regions MC2, one of the first wiring lines 122 that is connected to the first source/drain contact 110*a* may be elongated in the second direction D2 and may run across the write word line WWL. The first wiring contacts 120 and the first wiring lines 122 may include at least one selected from metal (e.g., copper, aluminum, or tungsten), doped polysilicon, and conductive metal nitride.

Referring to FIGS. 4, 6, and 8A to 8D, the second interlayer dielectric layer 115 may be provided thereon with a third interlayer dielectric layer 125 that covers the first wiring lines 122. The third interlayer dielectric layer 125 may include, for example, one or more of silicon oxide, silicon nitride, and silicon oxynitride.

Second wiring contacts 130 and second wiring lines 132 may be disposed in or on the third interlayer dielectric layer 125 on each of the first and second cell regions MC1 and MC2. The second wiring contacts 130 may penetrate the third interlayer dielectric layer 125 to come into connection with corresponding first wiring lines 122. The second wiring lines 132 may be disposed on the third interlayer dielectric layer 125 and may be correspondingly connected to the second wiring contacts 130. The second wiring lines 132 may be correspondingly electrically connected to the first, second, and third source/drain contacts 110*a*, 110*b*, and 110*c* through the second wiring contacts 130, the first wiring lines 122, and the first wiring contacts 120.

Each of the second wiring lines 132 may extend in the second direction D2 on the third interlayer dielectric layer 125. On each of the first cell regions MC1, one of the second wiring lines 132 that is connected to the second source/drain contact 110*b* may be elongated in the second direction D2 and may run across at least a portion of the write word line WWL and the third source/drain contact 110*c*. On each of the second cell regions MC2, one of the second wiring lines 132 that is connected to the first source/drain contact 110*a* may be elongated in the second direction D2 and may run across at least a portion of the read word line RWL and the third source/drain contact 110*c*. The second wiring contacts 130 and the second wiring lines 132 may include at least one selected from metal (e.g., copper, aluminum, or tungsten), doped polysilicon, and conductive metal nitride.

Referring to FIGS. 4, 7, and 8A to 8D, the third interlayer dielectric layer 125 may be provided thereon with a fourth interlayer dielectric layer 135 that covers the second wiring lines 132. The fourth interlayer dielectric layer 135 may include, for example, one or more of silicon oxide, silicon nitride, and silicon oxynitride.

A bit line BL may be disposed in the fourth interlayer dielectric layer 135 and may be connected to a corresponding one of the second wiring lines 132. The bit line BL may be electrically connected to the corresponding second wiring line 132 through a bit-line contact 144 that penetrates the fourth interlayer dielectric layer 135. The bit line BL may be electrically connected to the third source/drain contact 110*c* through the corresponding second wiring line 132, a corresponding second wiring contact 130, a corresponding first wiring line 122, and a corresponding first wiring contact 120. For example, the bit line BL may be connected in common to the third source/drain terminals of the read and write transistors M1 and M2 discussed with reference to FIGS. 1 and 2. The bit line BL may extend in the second direction D2, and may run across the write word line WWL and the read word line RWL. The bit line BL may include at least one selected from metal (e.g., copper, aluminum, or tungsten), doped polysilicon, and conductive metal nitride.

A plurality of bit lines BL may be disposed in the fourth interlayer dielectric layer 135. The bit lines BL may extend in the second direction D2 and may be spaced apart from each other in the first direction D1. The bit lines BL may be spaced apart from each other in the first direction D1, and may be correspondingly electrically connected to the third source/drain contacts 110*c* on the first cell regions MC1 and the second cell regions MC2 that are alternately arranged along the first direction D1. The bit lines BL may extend in the second direction D2 to run across the write and read word lines WWL and RWL on the first cell regions MC1 that are arranged in the second direction D2 and to run across the write and read word lines WWL and RWL on the second cell regions MC2 that are arranged in the second direction D2.

A lower electrode contact 140 may be disposed in the fourth interlayer dielectric layer 135 on each of the first and second cell regions MC1 and MC2. The lower electrode contact 140 may penetrate the fourth interlayer dielectric layer 135 and may be connected to a corresponding one of the second wiring lines 132. The lower electrode contact 140 may be electrically connected to the second source/drain contact 110*b* through the corresponding second wiring line 132, a corresponding second wiring contact 130, a corresponding first wiring line 122, and a corresponding first wiring contact 120.

A plurality of lower electrode contacts 140 may be disposed on the first cell regions MC1 and the second cell regions MC2. The lower electrode contacts 140 on the first cell regions MC1 and the second cell regions MC2 that are alternately arranged along the first direction D1 may be arranged in a zigzag fashion along the first direction D1. The lower electrode contacts 140 on the first cell regions MC1 arranged along the first direction D1 may be aligned in the first direction D1 and spaced apart from each other in the first direction D1. The lower electrode contacts 140 on the second cell regions MC2 arranged along the first direction D1 may be aligned in the first direction D1 and spaced apart from each other in the first direction D1. The lower electrode contacts 140 on the second cell regions MC2 arranged along the first direction D1 may be spaced apart in a third direction D3 from the lower electrode contacts 140 on the first cell regions MC1 arranged along the first direction D1. The third direction D3 may be parallel to the bottom surface 100L of the substrate 100, and may intersect all of the first and second directions D1 and D2. The third direction D3 may intersect the first direction D1 at an angle that is not ninety degrees (e.g., between 10 degrees and 80 degrees, such as 45, 50, 55, 60, 65, 70, 75, or 80 degrees), and may also intersect the second direction D2 at an angle that is not ninety degrees (e.g., between 10 degrees and 80 degrees, such as 45, 50, 55, 60, 65, 70, 75, or 80 degrees). For example, there may be a pair of lower electrode contacts 140 respectively disposed on the first cell region MC1 and the second cell region MC2 that neighbor each other in the first direction D1, and the pair of lower electrode contacts 140 may be aligned in the third direction D3 and spaced apart from each other in the third direction D3. The pair of lower electrode contacts 140 may be disposed symmetrical to each other in the third direction D3.

The lower electrode contacts 140 on the first cell regions MC1 arranged along the second direction D2 may be aligned in the second direction D2 and spaced apart from each other in the second direction D2. The lower electrode contacts 140 on the second cell regions MC2 arranged along the second direction D2 may be aligned in the second direction D2 and spaced apart from each other in the second direction D2. The lower electrode contacts 140 on the second cell regions MC2 arranged along the second direction D2 may be spaced apart in the third direction D3 from the lower electrode contacts 140 on the first cell regions MC1 arranged along the second direction D2.

The lower electrode contact 140 may include at least one selected from doped semiconductor materials (e.g., doped silicon such as doped polysilicon), metals (e.g., tungsten, titanium, and/or tantalum), metal-semiconductor compounds (e.g., metal silicide), and conductive metal nitrides (e.g., titanium nitride, tantalum nitride, and/or tungsten nitride).

On each of the first and second cell regions MC1 and MC2, a magnetic tunnel junction pattern MTJ may be disposed on the fourth interlayer dielectric layer 135 on each of the first and second cell regions MC1 and MC2 and on the lower electrode contact 140. The magnetic tunnel junction pattern MTJ may include a free magnetic pattern FL, a pinned magnetic pattern PL, and a tunnel barrier pattern TBL between the free and pinned magnetic patterns FL and PL. The pinned magnetic pattern PL may be disposed between the tunnel barrier pattern TBL and the lower electrode contact 140, and the free magnetic pattern FL may be spaced apart from the pinned magnetic pattern PL across the tunnel barrier pattern TBL. The magnetic tunnel junction pattern MTJ may be configured identically or substantially identical to the magnetic tunnel junction pattern MTJ discussed with reference to FIGS. 3A and 3B. The magnetic tunnel junction pattern MTJ may be electrically connected to the second source/drain contact 110*b* through the bottom electrode contact 140, the corresponding second wiring line 132, the corresponding second wiring contact 130, the corresponding first wiring line 122, and the corresponding first wiring contact 120. For example, the magnetic tunnel junction pattern MTJ may be connected to the second source/drain terminal of the read transistor M1 discussed with reference to FIGS. 1 and 2.

A plurality of magnetic tunnel junction patterns MTJ may be correspondingly disposed on the lower electrode contacts 140 on the first cell regions MC1 and the second cell regions MC2. The magnetic tunnel junction patterns MTJ on the first cell regions MC1 and the second cell regions MC2 that are alternately arranged along the first direction D1 may be arranged in a zigzag fashion along or with respect to the first direction D1. The magnetic tunnel junction patterns MTJ on the first cell regions MC1 arranged along the first direction D1 may be aligned in the first direction D1 and spaced apart from each other in the first direction D1. The magnetic tunnel junction patterns MTJ on the second cell regions MC2 arranged along the first direction D1 may be aligned in the first direction D1 and spaced apart from each other in the first direction D1. The magnetic tunnel junction patterns MTJ on the second cell regions MC2 arranged along the first direction D1 may be spaced apart in the third direction D3 from the magnetic tunnel junction patterns MTJ on the first cell regions MC1 arranged along the first direction D1. For example, there may be a pair of magnetic tunnel junction patterns MTJ respectively disposed on the first cell region MC1 and the second cell region MC2 that neighbor each other in the first direction D1, and the pair of magnetic tunnel junction patterns MTJ may be aligned in the third direction D3 and spaced apart from each other along the third direction D3. The pair of magnetic tunnel junction patterns MTJ may be disposed symmetrical to each other in the third direction D3. Each of the plurality of spin-orbit torque lines SOT may be arranged or tiled in a manner that is offset from the first and second directions D1 and D2.

The magnetic tunnel junction patterns MTJ on the first cell regions MC1 arranged along the second direction D2 may be aligned in the second direction D2 and spaced apart from each other in the second direction D2. The magnetic tunnel junction patterns MTJ on the second cell regions MC2 arranged along the second direction D2 may be aligned in the second direction D2 and spaced apart from each other in the second direction D2. The magnetic tunnel junction patterns MTJ on the second cell regions MC2 arranged along the second direction D2 may be spaced apart in the third direction D3 from the magnetic tunnel junction patterns MTJ on the first cell regions MC1 arranged along the second direction D2.

When viewed in a plan view, the magnetic tunnel junction patterns MTJ may be disposed at vertices of an imaginary polygon 500, and distances dl between the magnetic tunnel junction patterns MTJ may be the same as each other. The imaginary polygon 500 may be an equilateral polygon, such as a regular polygon. As used herein, the distance dl between the magnetic tunnel junction patterns MTJ may be defined to indicate a distance between a center of the magnetic tunnel junction pattern MTJ and a center of a neighboring magnetic tunnel junction pattern MTJ. According to some example embodiments, the imaginary polygon 500 may be a rhombus, such as an equilateral rhombus, such as a square rhombus or an equilateral rhombus having two acute angles and two obtuse angles. Four immediately neighboring ones of the magnetic tunnel junction patterns MTJ may be disposed at the vertices of the imaginary polygon 500 (e.g., rhombus), and the distances dl between the four magnetic tunnel junction patterns MTJ may be the same as each other.

The fourth interlayer dielectric layer 135 may be provided thereon with a fifth interlayer dielectric layer 145 that covers lateral surfaces of the magnetic tunnel junction pattern MTJ. The fifth interlayer dielectric layer 145 may include, for example, one or more of silicon oxide, silicon nitride, and silicon oxynitride.

A spin-orbit torque line SOT may be disposed on the fifth interlayer dielectric layer 145 on each of the first and second cell regions MC1 and MC2 and on the magnetic tunnel junction pattern MTJ. On the fifth interlayer dielectric layer 145, the spin-orbit torque line SOT may have a bar shape or an elliptical shape elongated in the second direction D2. The spin-orbit torque line SOT may include a first edge portion E1 and a second edge portion E2 that are opposite to each other in the second direction D2, and may also include a middle portion MP between the first and second edge portions E1 and E2. The magnetic tunnel junction pattern MTJ may overlap vertically (e.g., in the vertical direction VD perpendicular to the surface of the substrate 100) with the middle portion MP of the spin-orbit torque line SOT, and may be connected to a bottom surface of the middle portion MP.

The spin-orbit torque line SOT may have a width SOTw in the first direction D1. The width SOTw at the middle portion MP of the spin-orbit torque line SOT may be greater than a width of each of the first and second edge portions E1 and E2. As the magnetic tunnel junction pattern MTJ vertically overlaps the middle portion MP of the spin-orbit torque line SOT having a relatively large width, it may be possible to more easily increase a size of the magnetic tunnel junction pattern MTJ.

A plurality of spin-orbit torque lines SOT may be correspondingly disposed on the magnetic tunnel junction patterns MTJ on the first cell regions MC1 and the second cell regions MC2. The spin-orbit torque lines SOT on the first cell regions MC1 and the second cell regions MC2 that are alternately arranged along the first direction D1 may be arranged in a zigzag fashion along the first direction D1. The spin-orbit torque lines SOT on the first cell regions MC1 arranged along the first direction D1 may be aligned in the first direction D1 and spaced apart from each other in the first direction D1. The spin-orbit torque lines SOT on the second cell regions MC2 arranged along the first direction D1 may be aligned in the first direction D1 and spaced apart from each other in the first direction D1. The spin-orbit torque lines SOT on the second cell regions MC2 arranged along the first direction D1 may be spaced apart in the third direction D3 from the spin-orbit torque lines SOT on the first cell regions MC1 arranged along the first direction D1. For example, there may be a pair of spin-orbit torque lines SOT respectively disposed on the first cell region MC1 and the second cell region MC2 that neighbor each other in the first direction D1, and the pair of spin-orbit torque lines SOT may be aligned in the third direction D3 and spaced apart from each other in the third direction D3. The pair of spin-orbit torque lines SOT may be disposed symmetrical to each other in the third direction D3.

The spin-orbit torque lines SOT on the first cell regions MC1 arranged along the second direction D2 may be aligned in the second direction D2 and may be spaced apart from each other in the second direction D2. The spin-orbit torque lines SOT on the second cell regions MC2 arranged along the second direction D2 may be aligned in the second direction D2 and may be spaced apart from each other in the second direction D2. The spin-orbit torque lines SOT on the second cell regions MC2 arranged along the second direction D2 may be spaced apart in the third direction D3 from the spin-orbit torque lines SOT on the first cell regions MC1 arranged along the second direction D2.

When viewed in a plan view, the spin-orbit torque lines SOT may be disposed at the vertices of the imaginary polygon 500, such as an equilateral polygon, and may be spaced apart from each other. According to some example embodiments, the imaginary polygon 500 may be a rhombus. Four immediately neighboring ones of the spin-orbit torque lines SOT may be disposed at the vertices of the imaginary polygon 500 (e.g., rhombus) and may be spaced apart from each other.

A first conductive contact 150 may be disposed in the fifth interlayer dielectric layer 145 on each of the first and second cell regions MC1 and MC2. The first conductive contact 150 may penetrate the fifth interlayer dielectric layer 145 and the fourth interlayer dielectric layer 135, and may be connected to a corresponding one of the second wiring lines 132. The first conductive contact 150 may be electrically connected to the first source/drain contact 110*a* through the corresponding second wiring line 132, a corresponding second wiring contact 130, a corresponding first wiring line 122, and a corresponding first wiring contact 120.

The first conductive contact 150 may overlap vertically (e.g., in the vertical direction VD perpendicular to a top surface of the substrate 100) with the first edge portion E1 of the spin-orbit torque line SOT, and may be connected to a bottom surface of the first edge portion E1. The spin-orbit torque line SOT may be electrically connected to the first source/drain contact 110*a* through the corresponding first conductive contact 150, the corresponding second wiring line 132, the corresponding second wiring contact 130, the corresponding first wiring line 122, and the corresponding first wiring contact 120. For example, the spin-orbit torque line SOT may be connected through the first conductive contact 150 to the first source/drain terminal of the write transistor M2 discussed with reference to FIGS. 1 and 2. The first conductive contact 150 may include at least one selected from doped semiconductor materials (e.g., doped silicon such as doped polysilicon), metals (e.g., tungsten, titanium, and/or tantalum), metal-semiconductor compounds (e.g., metal silicide), and conductive metal nitrides (e.g., titanium nitride, tantalum nitride, and/or tungsten nitride).

The fifth interlayer dielectric layer 145 may be provided thereon with a sixth interlayer dielectric layer 155 that covers the spin-orbit torque line SOT. The sixth interlayer dielectric layer 155 may include, for example, one or more of silicon oxide, silicon nitride, and silicon oxynitride.

A second conductive contact 160 may be disposed in the sixth interlayer dielectric layer 155 on each of the first and second cell regions MC1 and MC2. The second conductive contact 160 may penetrate the sixth interlayer dielectric layer 155 and may be connected to the second edge portion E2 of the spin-orbit torque line SOT. The second conductive contact 160 may overlap vertically (e.g., in the vertical direction VD perpendicular to an upper surface of the substrate 100) with the second edge portion E2 of the spin-orbit torque line SOT, and may be connected to a top surface of the second edge portion E2. The second conductive contact 160 may include at least one selected from doped semiconductor materials (e.g., doped silicon such as doped polysilicon), metals (e.g., tungsten, titanium, and/or tantalum), metal-semiconductor compounds (e.g., metal silicide), and conductive metal nitrides (e.g., titanium nitride, tantalum nitride, and/or tungsten nitride).

A source line SL may be disposed on the sixth interlayer dielectric layer 155 and may be connected to the second conductive contact 160. The spin-orbit torque line SOT may be electrically connected through the second conductive contact 160 to the source line SL. The source line SL may extend in the second direction D2, and may run across the write word line WWL and the read word line RWL. The source line SL may be disposed above the spin-orbit torque line SOT, and may overlap vertically (e.g., in the vertical direction VD perpendicular to an upper surface of the substrate 100) with the spin-orbit torque line SOT. The source line SL may include at least one selected from metal (e.g., copper) and conductive metal nitride.

A plurality of source lines SL may be disposed on the sixth interlayer dielectric layer 155. The source lines SL may extend in the second direction D2 and may be spaced apart from each other in the first direction D1. The source lines SL may be spaced apart from each other in the first direction D1, and may be correspondingly connected to the second conductive contacts 160 on the first cell regions MC1 and the second cell regions MC2 that are alternately arranged along the first direction D1. The source lines SL may extend in the second direction D2 to run across the write and read word lines WWL and RWL on the first cell regions MC1 that are arranged in the second direction D2 and to run across the write and read word lines WWL and RWL on the second cell regions MC2 that are arranged in the second direction D2.

According to various example embodiments, the magnetic tunnel junction patterns MTJ may be disposed at the vertices of the imaginary polygon 500, and may be spaced apart from each other at the same distance dl. The imaginary polygon 500 may be an equilateral polygon. In addition, the spin-orbit torque lines SOT may be correspondingly disposed on the magnetic tunnel junction patterns MTJ and may be spaced apart from each other. When viewed in a plan view, when the magnetic tunnel junction patterns MTJ have the same area, as the magnetic tunnel junction patterns MTJ are disposed spaced apart from each other at the same distance dl, the distance dl between the magnetic tunnel junction patterns MTJ may become maximum. Therefore, during an etching process for forming the magnetic tunnel junction patterns MTJ, there may be a reduced or minimal effect between the magnetic tunnel junction patterns MTJ, and accordingly there may be an improvement in pattern uniformity of the magnetic tunnel junction patterns MTJ. Additionally or alternatively, the magnetic tunnel junction patterns MTJ may undergo a reduced or minimal effect caused by stray field (or demagnetizing field).

Furthermore, each of the magnetic tunnel junction patterns MTJ may be disposed to vertically overlap the middle portion MP of one of the spin-orbit torque lines SOT each having a relatively large width. Therefore, it may be possible to more easily increase a size of each of the magnetic tunnel junction patterns MTJ, and thus to improve thermal stability and/or data retention of the magnetic tunnel junction patterns MTJ.

Accordingly, there may be provided a spin-orbit torque-based magnetic memory device in which high integration is more easily achieved and whose thermal stability is improved.

Figure 9:
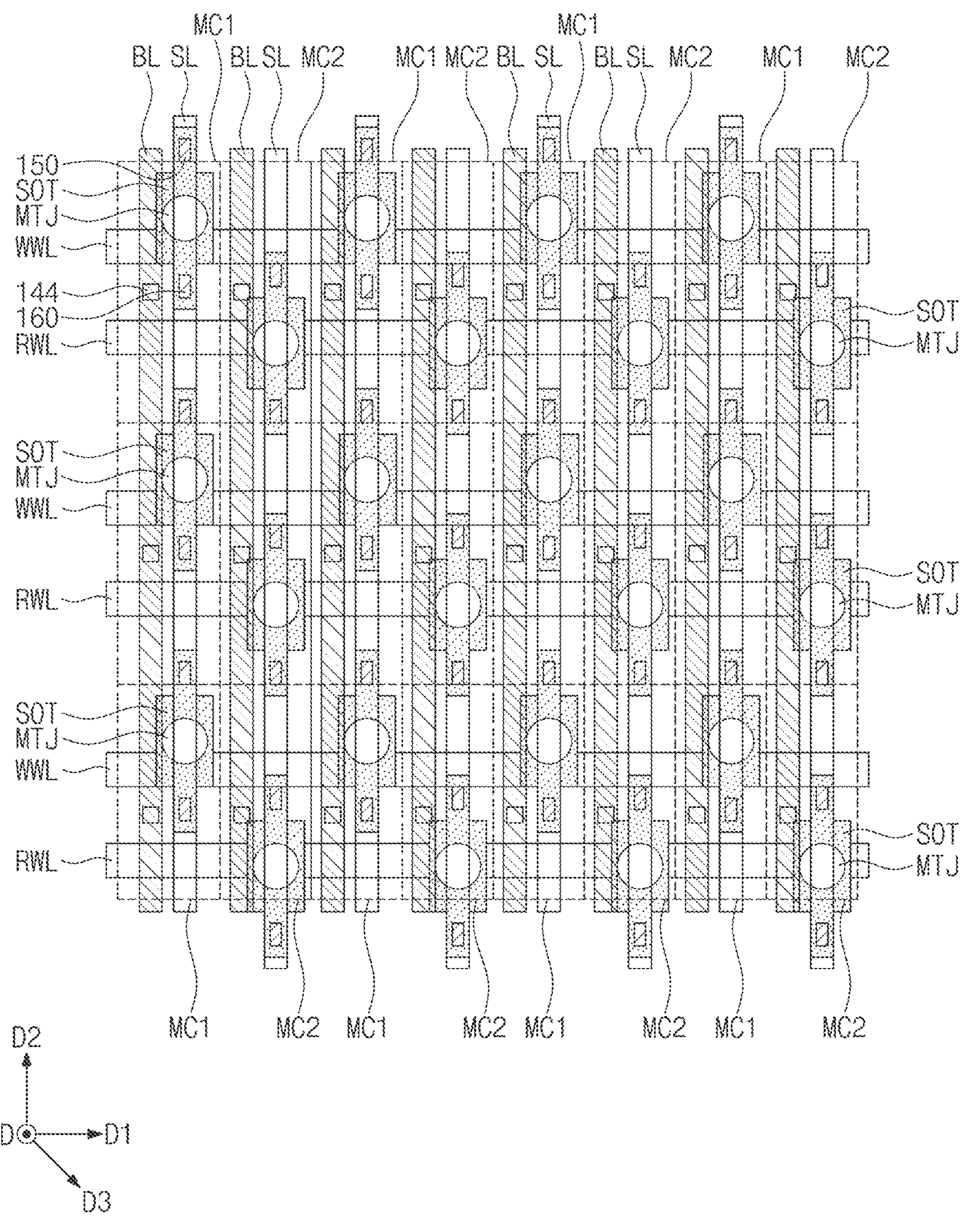
FIG. 9 illustrates a plan view showing a magnetic memory device according to some example embodiments of inventive concepts.
Figure 10:
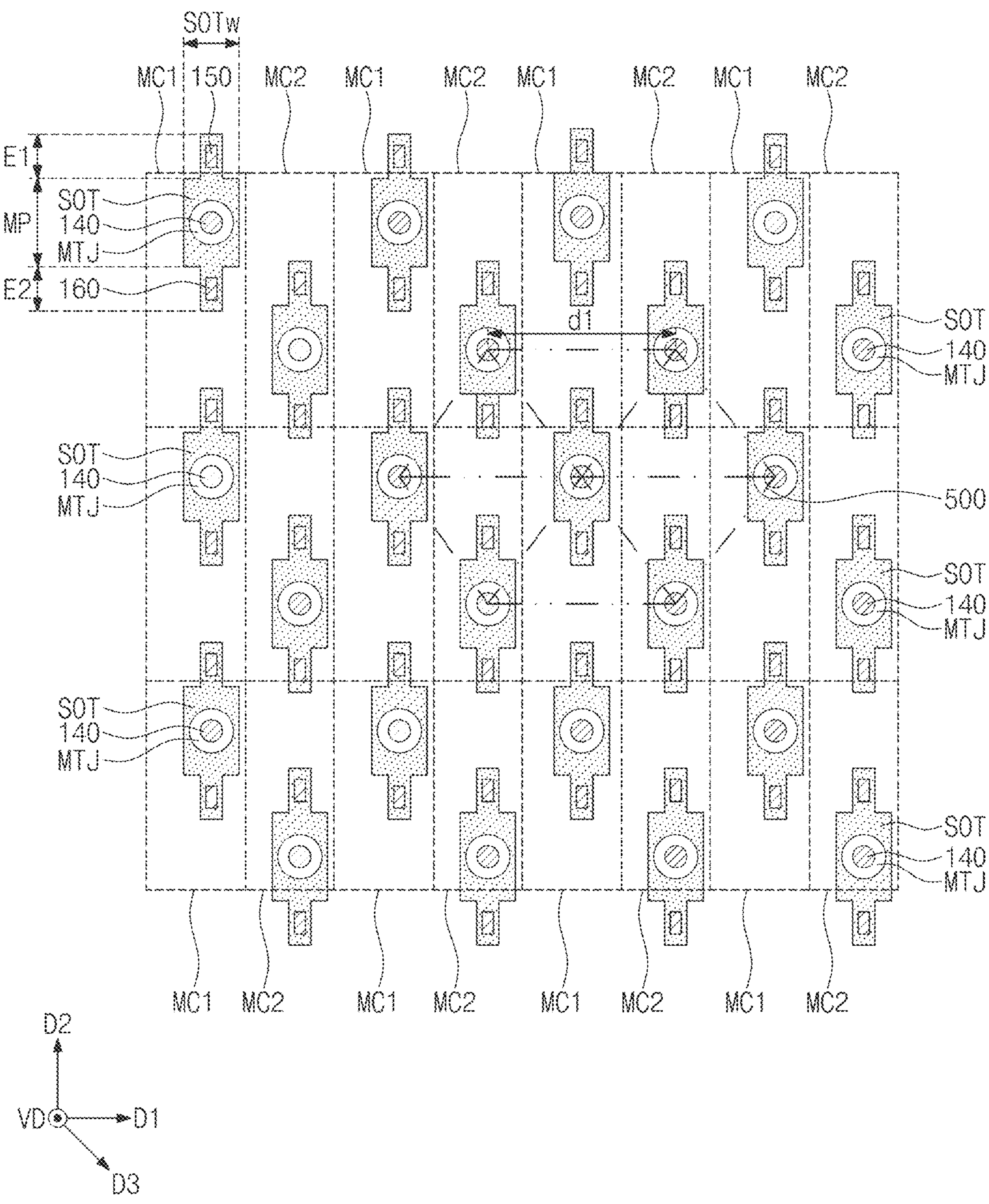
FIG. 10 illustrates a plan view showing an arrangement of magnetic tunnel junction patterns and spin-orbit torque lines of the magnetic memory device depicted in FIG. 9.

FIG. 9 illustrates a plan view showing a magnetic memory device according to some example embodiments of inventive concepts. FIG. 10 illustrates a plan view showing an arrangement of magnetic tunnel junction patterns and spin-orbit torque lines of the magnetic memory device depicted in FIG. 9. For brevity of description, the following will focus on differences from the magnetic memory device discussed with reference to FIGS. 4 to 7 and 8A to 8D.

Referring to FIGS. 9 and 10, a plurality of lower electrode contacts 140 may be disposed on each of the first cell regions MC1 and the second cell regions MC2. The lower electrode contacts 140 on the first cell regions MC1 and the second cell regions MC2 that are alternately arranged along the first direction D1 may be arranged in a zigzag fashion along the first direction D1. The lower electrode contacts 140 on the first cell regions MC1 arranged along the first direction D1 may be aligned in the first direction D1 and spaced apart from each other in the first direction D1. The lower electrode contacts 140 on the second cell regions MC2 arranged along the first direction D1 may be aligned in the first direction D1 and spaced apart from each other in the first direction D1. The lower electrode contacts 140 on the second cell regions MC2 arranged along the first direction D1 may be spaced apart in the third direction D3 from the lower electrode contacts 140 on the first cell regions MC1 arranged along the first direction D1. For example, there may be a pair of lower electrode contacts 140 respectively disposed on the first cell region MC1 and the second cell region MC2 that neighbor each other in the first direction D1, and the pair of lower electrode contacts 140 may be aligned in the third direction D3 and spaced apart from each other in the third direction D3. The pair of lower electrode contacts 140 may be disposed symmetrical to each other in the third direction D3.

The lower electrode contacts 140 on the first cell regions MC1 arranged along the second direction D2 may be aligned in the second direction D2 and spaced apart from each other in the second direction D2. The lower electrode contacts 140 on the second cell regions MC2 arranged along the second direction D2 may be aligned in the second direction D2 and spaced apart from each other in the second direction D2. The lower electrode contacts 140 on the second cell regions MC2 arranged along the second direction D2 may be spaced apart in the third direction D3 from the lower electrode contacts 140 on the first cell regions MC1 arranged along the second direction D2.

A plurality of magnetic tunnel junction patterns MTJ may be correspondingly disposed on the lower electrode contacts 140 on the first cell regions MC1 and the second cell regions MC2. The magnetic tunnel junction patterns MTJ on the first cell regions MC1 and the second cell regions MC2 that are alternately arranged along the first direction D1 may be arranged in a zigzag fashion along the first direction D1. The magnetic tunnel junction patterns MTJ on the first cell regions MC1 arranged along the first direction D1 may be aligned in the first direction D1 and spaced apart from each other in the first direction D1. The magnetic tunnel junction patterns MTJ on the second cell regions MC2 arranged along the first direction D1 may be aligned in the first direction D1 and spaced apart from each other in the first direction D1. The magnetic tunnel junction patterns MTJ on the second cell regions MC2 arranged along the first direction D1 may be spaced apart in the third direction D3 from the magnetic tunnel junction patterns MTJ on the first cell regions MC1 arranged along the first direction D1. For example, there may be a pair of magnetic tunnel junction patterns MTJ respectively disposed on the first cell region MC1 and the second cell region MC2 that neighbor each other in the first direction D1, and the pair of magnetic tunnel junction patterns MTJ may be aligned in the third direction D3 and spaced apart from each other along the third direction D3. The pair of magnetic tunnel junction patterns MTJ may be disposed symmetrical to each other in the third direction D3.

The magnetic tunnel junction patterns MTJ on the first cell regions MC1 arranged along the second direction D2 may be aligned in the second direction D2 and spaced apart from each other in the second direction D2. The magnetic tunnel junction patterns MTJ on the second cell regions MC2 arranged along the second direction D2 may be aligned in the second direction D2 and spaced apart from each other in the second direction D2. The magnetic tunnel junction patterns MTJ on the second cell regions MC2 arranged along the second direction D2 may be spaced apart in the third direction D3 from the magnetic tunnel junction patterns MTJ on the first cell regions MC1 arranged along the second direction D2.

When viewed in a plan view, the magnetic tunnel junction patterns MTJ may be disposed at vertices and a center of an imaginary polygon 500, and distances dl between the magnetic tunnel junction patterns MTJ may be the same as each other. The imaginary polygon 500 may be an equilateral polygon. According to some example embodiments, the imaginary polygon 500 may be a hexagon (e.g., an equilateral hexagon such as a regular hexagon). Seven immediately neighboring ones of the magnetic tunnel junction patterns MTJ may be disposed at the vertices and the center of the imaginary polygon 500 (e.g., equilateral or regular hexagon), and distances dl between the seven magnetic tunnel junction patterns MTJ may be the same as each other.

A plurality of spin-orbit torque lines SOT may be correspondingly disposed on the magnetic tunnel junction patterns MTJ on the first cell regions MC1 and the second cell regions MC2. The spin-orbit torque lines SOT on the first cell regions MC1 and the second cell regions MC2 that are alternately arranged along the first direction D1 may be arranged in a zigzag fashion along the first direction D1. The spin-orbit torque lines SOT on the first cell regions MC1 arranged along the first direction D1 may be aligned in the first direction D1 and spaced apart from each other in the first direction D1. The spin-orbit torque lines SOT on the second cell regions MC2 arranged along the first direction D1 may be aligned in the first direction D1 and spaced apart from each other in the first direction D1. The spin-orbit torque lines SOT on the second cell regions MC2 arranged along the first direction D1 may be spaced apart in the third direction D3 from the spin-orbit torque lines SOT on the first cell regions MC1 arranged along the first direction D1. For example, there may be a pair of spin-orbit torque lines SOT respectively disposed on the first cell region MC1 and the second cell region MC2 that neighbor each other in the first direction D1, and the pair of spin-orbit torque lines SOT may be aligned in the third direction D3 and spaced apart from each other in the third direction D3. The pair of spin-orbit torque lines SOT may be disposed symmetrical to each other in the third direction D3.

The spin-orbit torque lines SOT on the first cell regions MC1 arranged along the second direction D2 may be aligned in the second direction D2 and spaced apart from each other in the second direction D2. The spin-orbit torque lines SOT on the second cell regions MC2 arranged along the second direction D2 may be aligned in the second direction D2 and spaced apart from each other in the second direction D2. The spin-orbit torque lines SOT on the second cell regions MC2 arranged along the second direction D2 may be spaced apart in the third direction D3 from the spin-orbit torque lines SOT on the first cell regions MC1 arranged along the second direction D2.

When viewed in a plan view, the spin-orbit torque lines SOT may be disposed at the vertices and the center of the imaginary polygon 500, and may be spaced apart from each other. According to some example embodiments, the imaginary polygon 500 may be a hexagon (e.g., an equilateral hexagon such as a regular hexagon). Seven immediately neighboring ones of the spin-orbit torque lines SOT may be disposed at the vertices and the center of the imaginary polygon 500 (e.g., hexagon) and may be spaced apart from each other.

According to some example embodiments, the magnetic tunnel junction patterns MTJ may be disposed at the vertices and the center of the imaginary polygon 500, and may be spaced apart from each other at the same distance dl. In addition, the spin-orbit torque lines SOT may be correspondingly disposed on the magnetic tunnel junction patterns MTJ and may be spaced apart from each other. As the magnetic tunnel junction patterns MTJ are disposed at the vertices and the center of the imaginary polygon 500 and are spaced apart from each other at the same distance dl, when the magnetic tunnel junction patterns MTJ have the same area, the distance dl between the magnetic tunnel junction patterns MTJ may have a maximum value. Therefore, the magnetic tunnel junction patterns MTJ may have increased high integration and/or an improved pattern uniformity.

Furthermore, each of the magnetic tunnel junction patterns MTJ may be disposed to vertically overlap the middle portion MP of one of the spin-orbit torque lines SOT each having a relatively large width. Therefore, it may be possible to more easily increase a size of each of the magnetic tunnel junction patterns MTJ, and thus to improve thermal stability and/or data retention of the magnetic tunnel junction patterns MTJ.

Accordingly, there may be provided a spin-orbit torque-based magnetic memory device in which high integration is easily achieved and whose thermal stability is improved.

Figure 11:
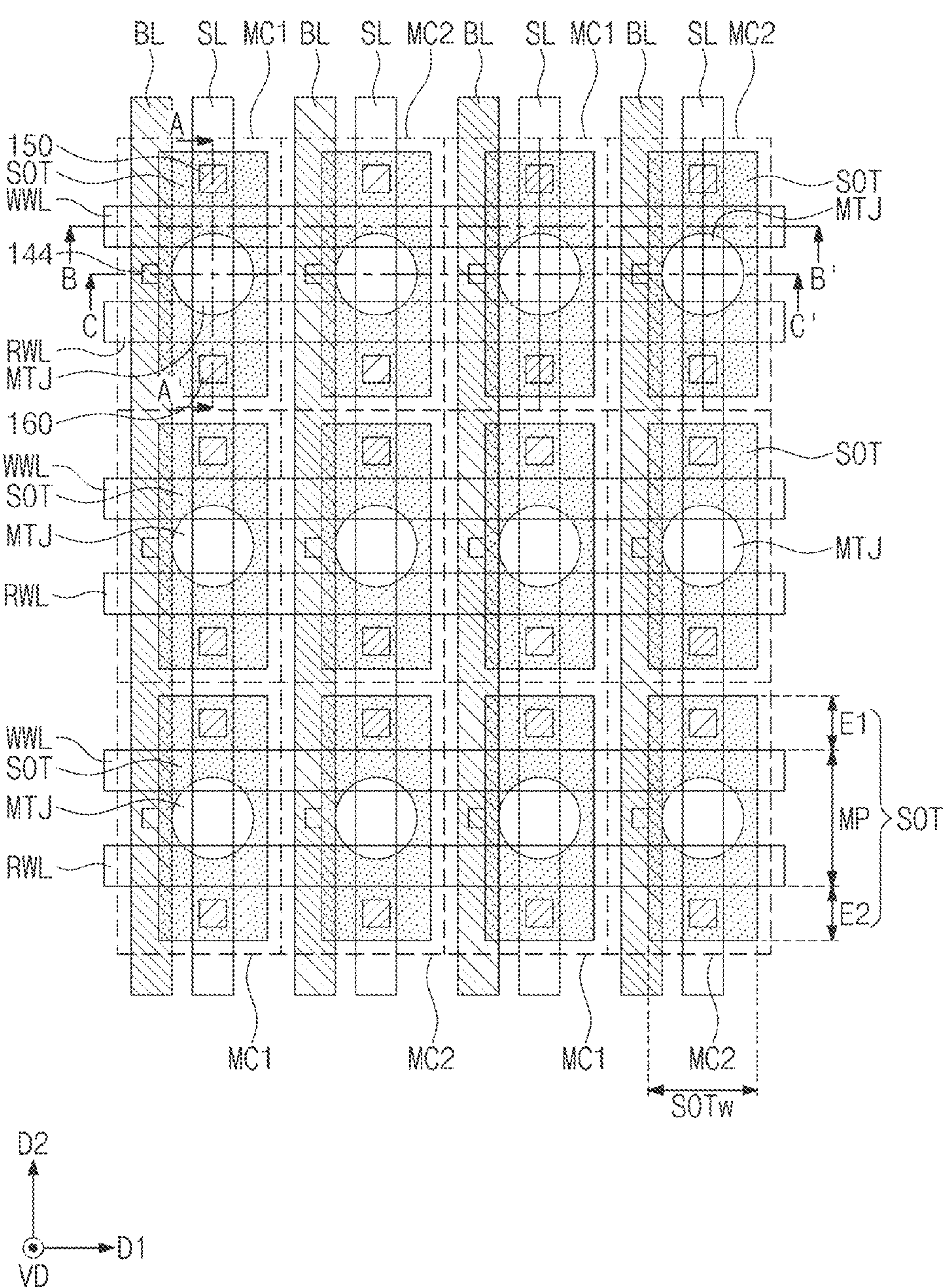
FIG. 11 illustrates a plan view showing a magnetic memory device according to some example embodiments of inventive concepts.
Figure 12:
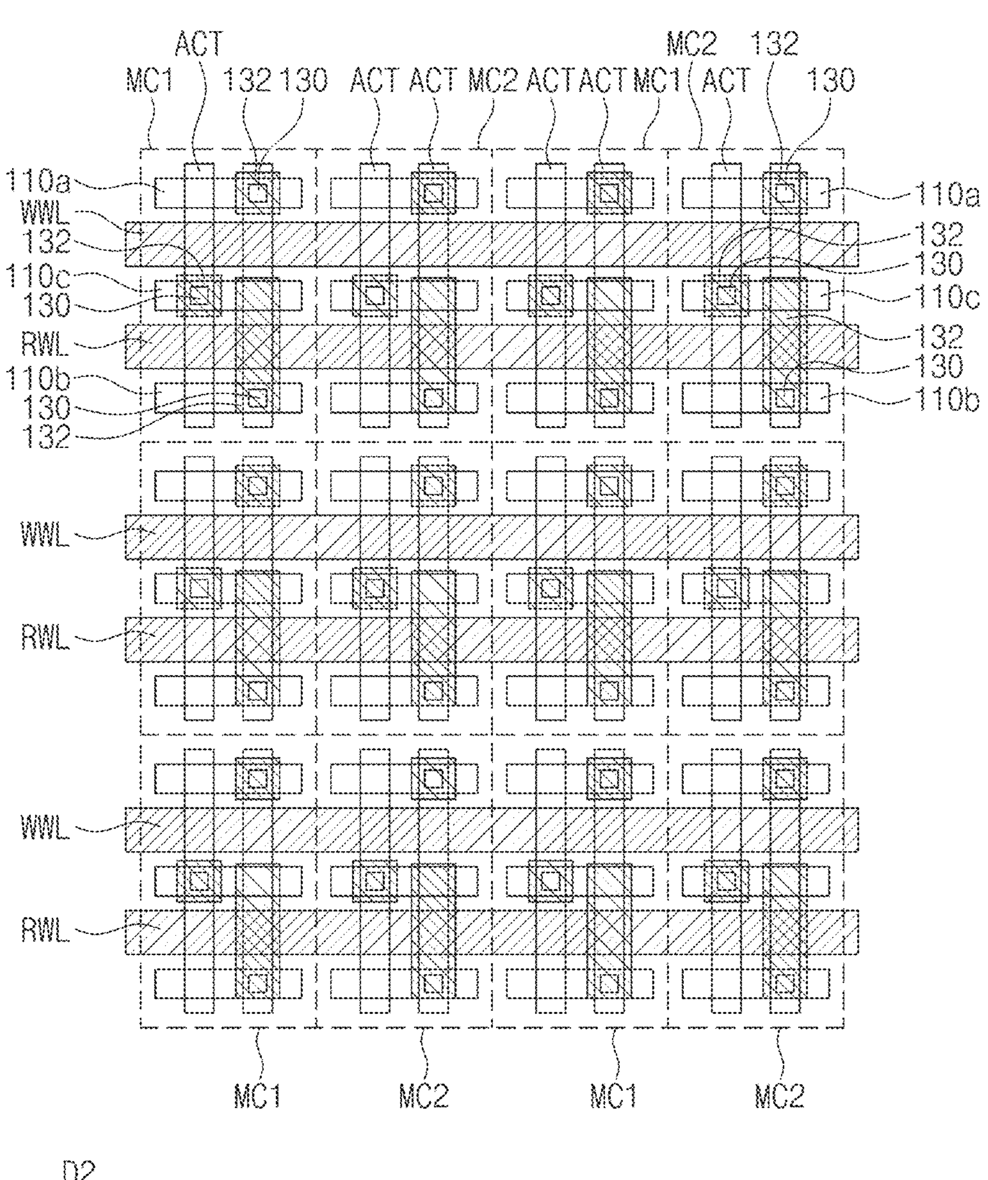
FIG. 12 illustrates a plan view showing wiring patterns of the magnetic memory device depicted in FIG. 11.
Figure 12:
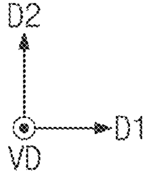
Figure 13A:
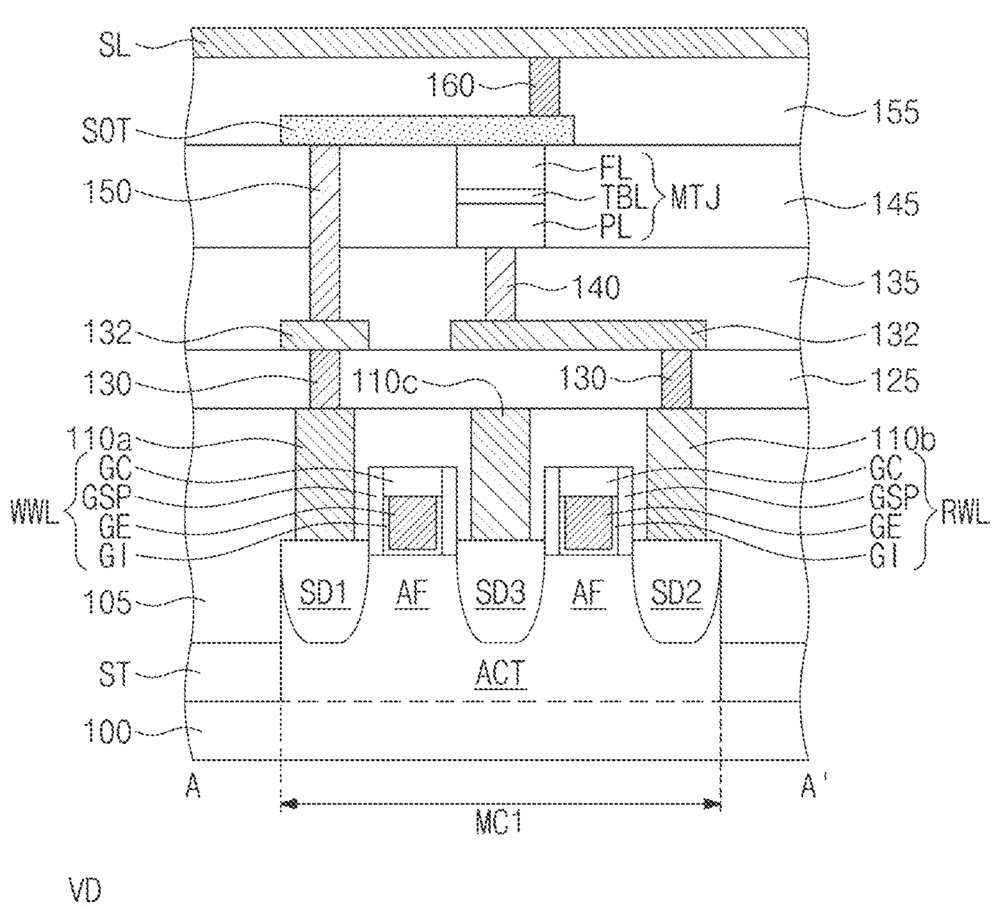
FIGS. 13A, 13B, and 13C illustrate cross-sectional views respectively taken along lines A-A', B-B', and C-C' of FIG. 11.
Figure 13B:
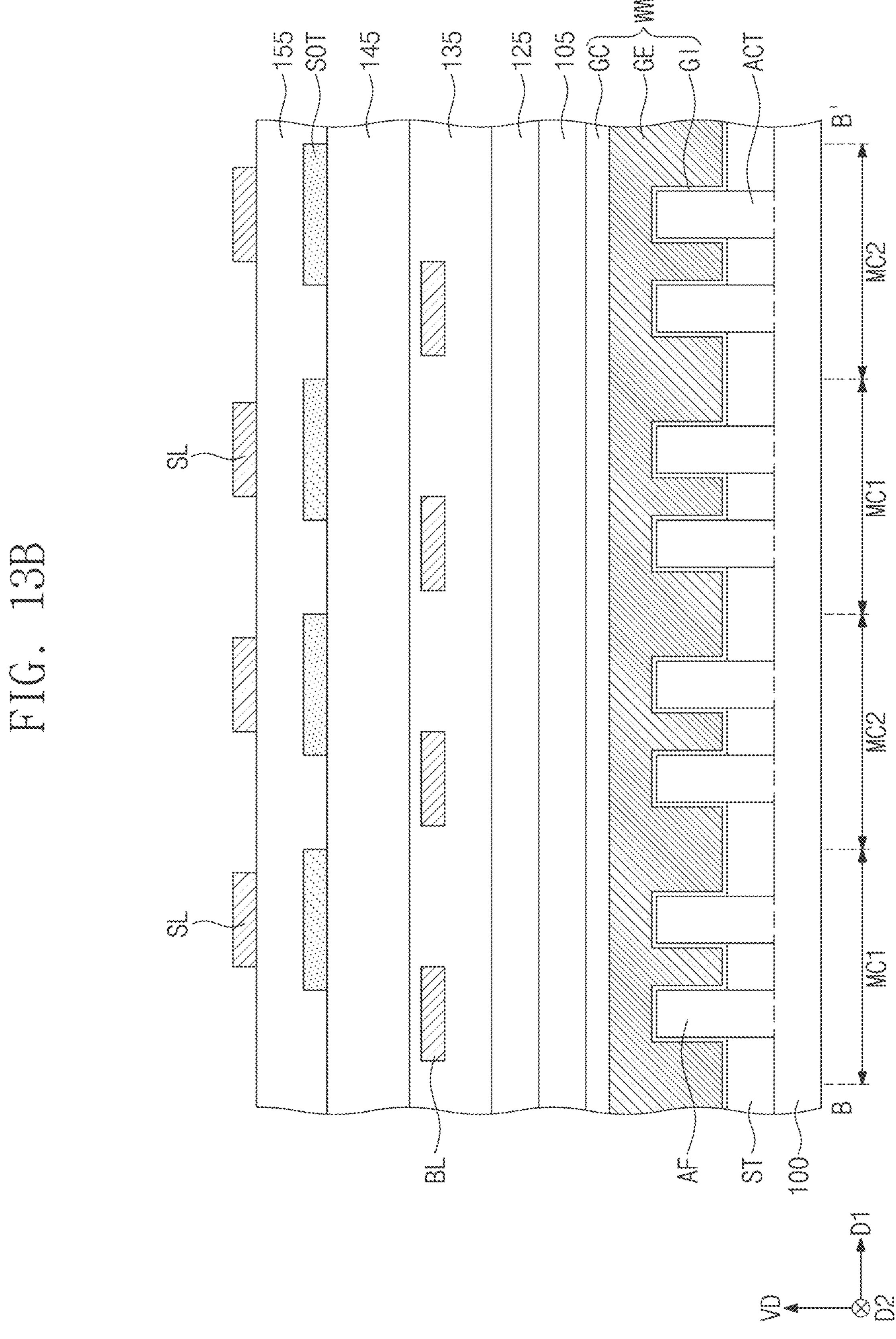
Figure 13C:
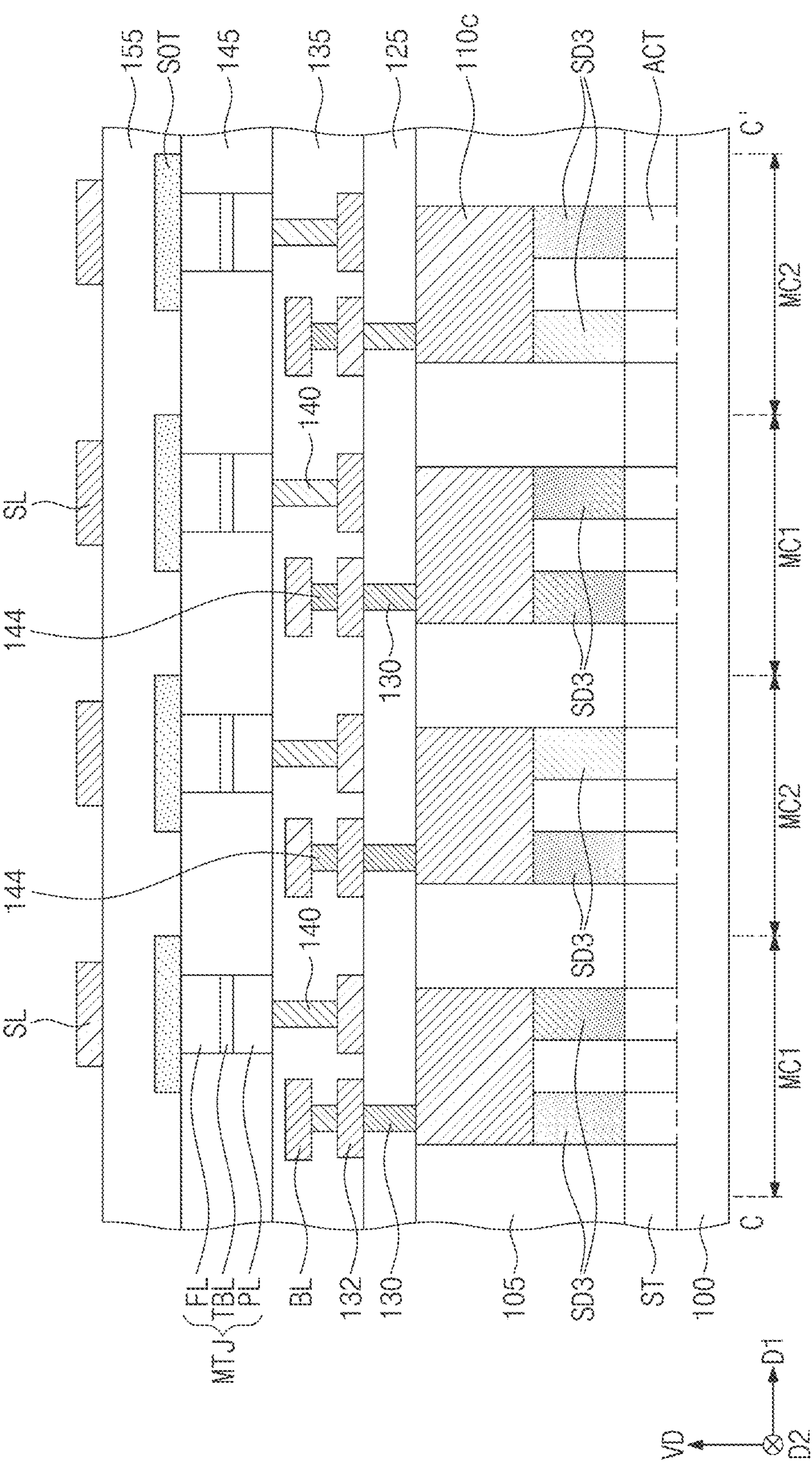

FIG. 11 illustrates a plan view showing a magnetic memory device according to some example embodiments of inventive concepts. FIG. 12 illustrates a plan view showing wiring patterns of the magnetic memory device depicted in FIG. 11. FIGS. 13A, 13B, and 13C illustrate cross-sectional views respectively taken along lines A-A', B-B', and C-C' of FIG. 11. For brevity of description, the following will focus on differences from the magnetic memory device discussed with reference to FIGS. 4 to 7 and 8A to 8D.

Referring to FIGS. 11, 12, and 13A to 13C, the third interlayer dielectric layer 125 may be disposed on the first interlayer dielectric layer 105, and may cover the top surfaces of the source/drain contacts 110*a*, 110*b*, and 110*c*. According to some example embodiments, all of the second interlayer dielectric layer 115, the first wiring contacts 120, and the first wiring lines 122 may be omitted, but inventive concepts are not limited thereto.

Wiring contacts 130 and wiring lines 132 may be disposed in or on the third interlayer dielectric layer 125 on each of the first and second cell regions MC1 and MC2. The wiring contacts 130 may penetrate the third interlayer dielectric layer 125, and may be correspondingly connected to the first, second, and third source/drain contacts 110*a*, 110*b*, and 110*c*. The wiring lines 132 may be disposed on the third interlayer dielectric layer 125 and may be corresponding connected to the wiring contacts 130. The wiring lines 132 may be electrically connected through the wiring contacts 130 to corresponding first, second, and third source/drain contacts 110*a*, 110*b*, and 110*c*.

Each of the wiring lines 132 may extend in the second direction D2 on the third interlayer dielectric layer 125. On each of the first cell regions MC1 and the second cell regions MC2, one of the wiring lines 132 that is connected to the second source/drain contact 110*b* may be elongated in the second direction D2 and may run across the read word line RWL. The wiring contacts 130 and the wiring lines 132 may include at least one selected from metal (e.g., copper, aluminum, or tungsten), doped polysilicon, and conductive metal nitride.

The fourth interlayer dielectric layer 135 may be disposed on the third interlayer dielectric layer 125, covering the wiring lines 132. The bit line BL may be disposed in the fourth interlayer dielectric layer 135, and may be connected to a corresponding one of the wiring lines 132. The bit line BL may be electrically connected to the wiring line 132 through the bit-line contact 144 that penetrates the fourth interlayer dielectric layer 135. The bit line BL may be electrically connected to the third source/drain contact 110*c* through the corresponding wiring line 132 and a corresponding wiring contact 130. The bit line BL may extend in the second direction D2, and may run across the write word line WWL and the read word line RWL.

The bottom electrode contact 140 may be disposed in the fourth interlayer dielectric layer 135 on each of the first and second cell regions MC1 and MC2. The lower electrode contact 140 may penetrate the fourth interlayer dielectric layer 135, and may be connected to a corresponding one of the wiring lines 132. The lower electrode contact 140 may be electrically connected to the second source/drain contact 110*b* through the corresponding second wiring line 132 and a corresponding wiring contact 130.

A plurality of lower electrode contacts 140 may be disposed on the first cell regions MC1 and the second cell regions MC2. The lower electrode contacts 140 on the first cell regions MC1 and the second cell regions MC2 that are alternately arranged along the first direction D1 may be aligned in the first direction D1 and spaced apart from each other in the first direction D1. The lower electrode contacts 140 on the first cell regions MC1 arranged along the second direction D2 may be aligned in the second direction D2 and spaced apart from each other in the second direction D2. The lower electrode contacts 140 on the second cell regions MC2 arranged along the second direction D2 may be aligned in the second direction D2 and spaced apart from each other in the second direction D2.

The magnetic tunnel junction pattern MTJ may be disposed on the fourth interlayer dielectric layer 135 on each of the first and second cell regions MC1 and MC2 and on the lower electrode contact 140. The magnetic tunnel junction pattern MTJ may be electrically connected to the second source/drain contact 110*b* through the corresponding lower electrode contact 140, the corresponding wiring line 132, and the corresponding second wiring contact 130. For example, the magnetic tunnel junction pattern MTJ may be connected to the second source/drain terminal of the read transistor M1 discussed with reference to FIGS. 1 and 2.

A plurality of magnetic tunnel junction patterns MTJ may be correspondingly disposed on the lower electrode contacts 140 on the first cell regions MC1 and the second cell regions MC2. The magnetic tunnel junction patterns MTJ on the first cell regions MC1 and the second cell regions MC2 that are alternately arranged along the first direction D1 may be aligned in the first direction D1 and spaced apart from each other in the first direction D1. The magnetic tunnel junction patterns MTJ on the first cell regions MC1 arranged along the second direction D2 may be aligned in the second direction D2 and spaced apart from each other in the second direction D2. The magnetic tunnel junction patterns MTJ on the second cell regions MC2 arranged along the second direction D2 may be aligned in the second direction D2 and spaced apart from each other in the second direction D2.

The fifth interlayer dielectric layer 145 may be disposed on the fourth interlayer dielectric layer 135, and may cover lateral surfaces of the magnetic tunnel junction patterns MTJ. The spin-orbit torque line SOT may be disposed on the fifth interlayer dielectric layer 145 on each of the first and second cell regions MC1 and MC2 and on the magnetic tunnel junction pattern MTJ. On the fifth interlayer dielectric layer 145, the spin-orbit torque line SOT may have a bar shape elongated in the second direction D2. The spin-orbit torque line SOT may include a first edge portion E1 and a second edge portion E2 that are opposite to each other in the second direction D2, and may also include a middle portion MP between the first and second edge portions E1 and E2. The magnetic tunnel junction pattern MTJ may overlap vertically (e.g., in the vertical direction VD) with the middle portion MP of the spin-orbit torque line SOT, and may be connected to a bottom surface of the middle portion MP.

The spin-orbit torque line SOT may have a width SOTw in the first direction D1. According to some example embodiments, the width SOTw of each of the first and second edge portions E1 and E2 of the spin-orbit torque line SOT may be the same or substantially the same as the width SOTw of the middle portion MP of the spin-orbit torque line SOT. Each of the first edge portion E1, the second edge portion E2, and the middle portion MP of the spin-orbit torque line SOT may extend in the first direction D1 to overlap vertically (e.g., in the vertical direction VD) with a portion of the bit line BL.

A plurality of spin-orbit torque lines SOT may be correspondingly disposed on the magnetic tunnel junction patterns MTJ on the first cell regions MC1 and the second cell regions MC2. The spin-orbit torque lines SOT on the first cell regions MC1 and the second cell regions MC2 that are alternately arranged along the first direction D1 may be aligned in the first direction D1 and spaced apart from each other in the first direction D1. The spin-orbit torque lines SOT on the first cell regions MC1 arranged along the second direction D2 may be aligned in the second direction D2 and spaced apart from each other in the second direction D2. The spin-orbit torque lines SOT on the second cell regions MC2 arranged along the second direction D2 may be aligned in the second direction D2 and spaced apart from each other in the second direction D2.

The first conductive contact 150 may be disposed in the fifth interlayer dielectric layer 145 on each of the first and second cell regions MC1 and MC2. The first conductive contact 150 may penetrate the fifth interlayer dielectric layer 145 and the fourth interlayer dielectric layer 135, and may be connected to a corresponding one of the wiring lines 132. The first conductive contact 150 may be electrically connected to the first source/drain contact 110*a* through the corresponding wiring line 132 and a corresponding wiring contact 130.

The first conductive contact 150 may overlap vertically (e.g., in the vertical direction VD) with the first edge portion E1 of the spin-orbit torque line SOT, and may be connected to a bottom surface of the first edge portion E1. The spin-orbit torque line SOT may be electrically connected to the first source/drain contact 110*a* through the first conductive contact 150, the corresponding wiring line 132, and the corresponding wiring contact 130. For example, the spin-orbit torque line SOT may be connected through the first conductive contact 150 to the first source/drain terminal of the write transistor M2 discussed with reference to FIGS. 1 and 2.

The sixth interlayer dielectric layer 155 may be disposed on the fifth interlayer dielectric layer 145, and may cover the spin-orbit torque line SOT. The second conductive contact 160 may be disposed in the sixth interlayer dielectric layer 155 on each of the first and second cell regions MC1 and MC2. The second conductive contact 160 may penetrate the sixth interlayer dielectric layer 155 and may be connected to the second edge portion E2 of the spin-orbit torque line SOT. The source line SL may be disposed on the sixth interlayer dielectric layer 155, and may be connected to the second conductive contact 160.

According to some example embodiments, each of the first edge portion E1, the second edge portion E2, and the middle portion MP of the spin-orbit torque line SOT may extend in the first direction D1 to overlap vertically (e.g., in the vertical direction VD) with a portion of the bit line BL. For example, the width SOTw of the spin-orbit torque line SOT may increase, and accordingly it may be easy to increase a size of the magnetic tunnel junction pattern MTJ. Therefore, the magnetic tunnel junction patterns MTJ may improve in thermal stability and data retention.

Accordingly, there may be provided a spin-orbit torque-based magnetic memory device in which high integration is more easily achieved and/or whose thermal stability is improved.

Figure 14:
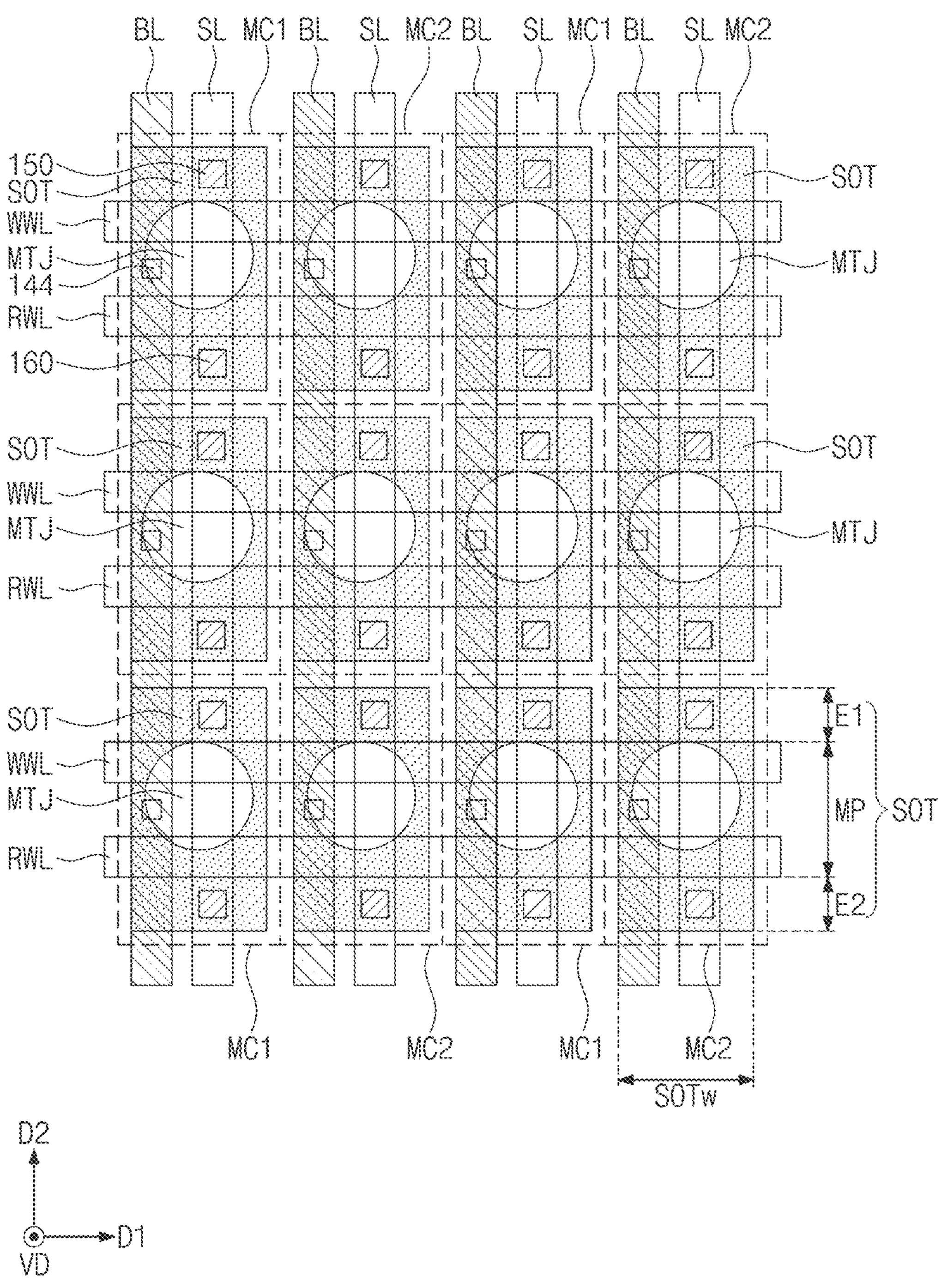
FIG. 14 illustrates a plan view showing a magnetic memory device according to some example embodiments of inventive concepts.

FIG. 14 illustrates a plan view showing a magnetic memory device according to some example embodiments of inventive concepts. For brevity of description, the following will focus on differences from the magnetic memory device discussed with reference to FIGS. 11, 12, and 13A to 13C.

Referring to FIG. 14, the spin-orbit torque line SOT may include a first edge portion E1 and a second edge portion E2 that are opposite to each other in the second direction D2, and may also include a middle portion MP between the first and second edge portions E1 and E2. The magnetic tunnel junction pattern MTJ may overlap vertically (e.g., in the vertical direction VD) with the middle portion MP of the spin-orbit torque line SOT, and may be connected to a bottom surface of the middle portion MP.

The spin-orbit torque line SOT may have a width SOTw in the first direction D1. According to some example embodiments, the width SOTw of each of the first and second edge portions E1 and E2 of the spin-orbit torque line SOT may be substantially the same as the width SOTw of the middle portion MP of the spin-orbit torque line SOT. Each of the first edge portion E1, the second edge portion E2, and the middle portion MP of the spin-orbit torque line SOT may extend in the first direction D1 to overlap vertically (e.g., in the vertical direction VD) with the bit line BL and also to run across the bit line BL.

According to some example embodiments, the width SOTw of the spin-orbit torque line SOT may become maximum, and accordingly it may be easier to increase a size of the magnetic tunnel junction pattern MTJ. Therefore, the magnetic tunnel junction patterns MTJ may improve in thermal stability and/or data retention.

Accordingly, there may be provided a spin-orbit torque-based magnetic memory device whose thermal stability is improved.

According to inventive concepts, magnetic tunnel junction patterns may be arranged equally spaced apart from each other, and spin-orbit torque lines may be correspondingly disposed on the magnetic tunnel junction patterns and may be spaced apart from each other. When viewed in a plan view, when the magnetic tunnel junction patterns have the same area, as the magnetic tunnel junction patterns are disposed spaced apart from each other at the same distance, a distance between the magnetic tunnel junction patterns may become maximum. Therefore, during an etching process for forming the magnetic tunnel junction patterns, there may be a reduced or minimal effect between the magnetic tunnel junction patterns, and accordingly there may be an improvement in pattern uniformity of the magnetic tunnel junction patterns. Moreover, the magnetic tunnel junction patterns may undergo a minimum effect caused by stray field.

Furthermore, each of the magnetic tunnel junction patterns may be disposed to vertically overlap a middle portion of one of the spin-orbit torque lines each having a relatively large width. Therefore, it may be possible to more easily increase a size of each of the magnetic tunnel junction patterns, and thus to improve thermal stability and/or data retention of the magnetic tunnel junction patterns.

Accordingly, there may be provided a spin-orbit torque-based magnetic memory device in which high integration is easily achieved and whose thermal stability is improved.

The aforementioned description provides some example embodiments for explaining inventive concepts. Therefore, inventive concepts are not limited to the embodiments described above, and it will be understood by one of ordinary skill in the art that variations in form and detail may be made therein without departing from the spirit and essential features of inventive concepts. Furthermore example embodiments are not necessarily mutually exclusive. For example, some example embodiments may include one or more features described with reference to one or more figures, and may also include one or more other features described with reference to one or more other figures.

What is claimed is:

1. A magnetic memory device, comprising:

a write word line and a read word line that extend in a first direction on a substrate, and the write word line and the read word line are spaced apart from each other in a second direction, the first direction and the second direction intersecting each other and parallel to a bottom surface of the substrate;

a plurality of first source/drain contacts on one side of the write word line and spaced apart from each other in the first direction;

a plurality of second source/drain contacts on one side of the read word line and spaced apart from each other in the first direction;

a plurality of magnetic tunnel junction patterns, each of the plurality of magnetic tunnel junction patterns correspondingly connected to a one of the plurality of second source/drain contacts; and a plurality of spin-orbit torque lines, each of the plurality of spin-orbit torque lines correspondingly on a one of the plurality of magnetic tunnel junction patterns and correspondingly connected to a one of the plurality of first source/drain contacts, wherein the plurality of magnetic tunnel junction patterns comprises a first plurality of magnetic tunnel junction patterns arranged in a first row extending in the first direction and a second plurality of magnetic tunnel junction patterns arranged in a second row extending in the first direction, wherein the first row is offset from the second row in the second direction, and wherein magnetic tunnel junction patterns in the first plurality of magnetic tunnel junction patterns are offset, in the first direction, from immediately neighboring magnetic tunnel junction patterns in the second plurality of magnetic tunnel junction patterns.

2. The magnetic memory device of claim 1, further comprising:

a plurality of third source/drain contacts between the write word line and the read word line, the plurality of third source/drain contacts being spaced apart from each other in the first direction; and a plurality of bit lines that extend in the second direction, the bit lines being spaced apart from each other in the first direction, wherein the each of the plurality of bit lines are correspondingly connected to a one of the plurality of third source/drain contacts.

3. The magnetic memory device of claim 1, wherein each of the plurality of spin-orbit torque lines has one of a bar shape or an elliptical shape, the bar shape or the elliptical shape elongated in the second direction.

4. The magnetic memory device of claim 3, further comprising:

a plurality of source lines, each of the plurality of source lines correspondingly connected to a one of the plurality of spin-orbit torque lines, each of the plurality of spin-orbit torque lines includes a first edge portion and a second edge portion that are opposite to each other in the second direction, the first edge portion is connected to a corresponding one of the plurality of first source/drain contacts, and the second edge portion is connected to a corresponding one of the plurality of source lines.

5. The magnetic memory device of claim 4, wherein the plurality of source lines are correspondingly above the plurality of spin-orbit torque lines.

6. The magnetic memory device of claim 5, further comprising:

a first conductive contact that is connected to the first edge portion of each of the plurality of spin-orbit torque lines, wherein the first conductive contact is connected to a bottom surface of each of the plurality of spin-orbit torque lines, and the first edge portion is connected through the first conductive contact to the corresponding one of the first source/drain contacts.

7. The magnetic memory device of claim 6, further comprising:

a second conductive contact that is connected to the second edge portion of each of the plurality of spin-orbit torque lines, wherein the second conductive contact is connected to a top surface of each of the plurality of spin-orbit torque lines, and the second edge portion is connected through the second conductive contact to the corresponding one of the plurality of source lines.

8. The magnetic memory device of claim 3, wherein each of the plurality of spin-orbit torque lines includes:

a first edge portion and a second edge portion that are opposite to each other in the second direction; and a middle portion between the first edge portion and the second edge portion, wherein each of the plurality of magnetic tunnel junction patterns vertically overlaps the middle portion of one of the plurality of spin-orbit torque lines.

9. The magnetic memory device of claim 8, wherein a width in the first direction of the middle portion is greater than a width in the first direction of each of the first edge portion and the second edge portion.

10. The magnetic memory device of claim 8, wherein each of the plurality of magnetic tunnel junction patterns is on a bottom surface of one of the plurality of spin-orbit torque lines.

11. A magnetic memory device, comprising:

a plurality of magnetic tunnel junction patterns on a substrate, the plurality of magnetic tunnel junction patterns spaced apart from each other along a first direction and a second direction, the first direction and the second direction intersecting each other and parallel to a bottom surface of the substrate; and a plurality of spin-orbit torque lines, each of the plurality of spin-orbit torque lines corresponding on a one of the plurality of magnetic tunnel junction patterns and spaced apart from each other along the first direction and the second direction, wherein when viewed in a plan view, immediately neighboring ones of the plurality of magnetic tunnel junction patterns are spaced apart from each other to reside at vertices of an imaginary polygon, immediately neighboring ones of the plurality of spin-orbit torque lines are spaced apart from each other to reside at the vertices of the imaginary polygon, and the imaginary polygon is an equilateral polygon.

12. The magnetic memory device of claim 11, wherein the imaginary polygon is a rhombus or a hexagon.

13. The magnetic memory device of claim 11, wherein the imaginary polygon is a rhombus, four immediately neighboring ones of the plurality of magnetic tunnel junction patterns are correspondingly at the vertices of the imaginary polygon, and four immediately neighboring ones of the plurality of spin-orbit torque lines are correspondingly at the vertices of the imaginary polygon.

14. The magnetic memory device of claim 13, wherein the imaginary polygon is an equilateral rhombus.

15. The magnetic memory device of claim 11, wherein the imaginary polygon is a hexagon, seven immediately neighboring ones of the plurality of magnetic tunnel junction patterns are correspondingly disposed at vertices and a center of the imaginary polygon, and seven immediately neighboring ones of the plurality of spin-orbit torque lines are correspondingly disposed at the vertices and the center of the imaginary polygon.

16. The magnetic memory device of claim 15, wherein the imaginary polygon is an equilateral hexagon.

17. The magnetic memory device of claim 11, further comprising:

a plurality of write word lines on the substrate and a plurality of read word lines on the substrate, the plurality of read and write word lines extending in the first direction and alternately arranged along the second direction, wherein each of the plurality of spin-orbit torque lines is connected to a first source/drain terminal of a write transistor that is configured to be controlled by a corresponding one of the plurality of write word lines, and each of the plurality of magnetic tunnel junction patterns is connected to a second source/drain terminal of a read transistor that is configured to be controlled by a corresponding one of the plurality of read word lines.

18. The magnetic memory device of claim 17, wherein each of the plurality of spin-orbit torque lines has one of a bar shape or an elliptical shape, the bar shape or the elliptical shape elongated in the second direction.

19. A magnetic memory device, comprising:

a substrate that includes a plurality of first cell regions and a plurality of second cell regions, the plurality of first cell regions and the second cell regions being alternately and repeatedly arranged along a first direction that is parallel to a bottom surface of the substrate;

a plurality of magnetic tunnel junction patterns that are correspondingly on the first cell regions and the second cell regions; and a plurality of spin-orbit torque lines that are correspondingly on ones of the plurality of the magnetic tunnel junction patterns and are correspondingly on ones of the first cell regions and ones of the second cell regions, wherein the plurality of magnetic tunnel junction patterns are arranged in a zigzag fashion along the first direction, and the plurality of spin-orbit torque lines are arranged in a zigzag fashion along the first direction.

20. The magnetic memory device of claim 19, further comprising:

a write word line and a read word line that run across the plurality of first cell regions and the plurality of second cell regions, wherein the write word line and the read word line extend in the first direction and are spaced apart from each other in a second direction, some of the plurality of spin-orbit torque lines are spaced apart from each other in the first direction, the some of the plurality of spin-orbit torque lines being on at least one of the plurality of first cell regions, others of the plurality of spin-orbit torque lines are spaced apart from each other in the first direction, the others of the plurality of spin-orbit torque lines being on the at least one of the plurality of second cell regions, the plurality of spin-orbit torque lines on the second cell regions are spaced apart in a third direction from the plurality of spin-orbit torque lines on the first cell regions, and the third direction is parallel to the bottom surface of the substrate and intersects the first direction and the second direction.

* * * * *